(12) United States Patent
Hertel

(10) Patent No.: US 11,774,652 B2
(45) Date of Patent: Oct. 3, 2023

(54) OMNI-SPECTRAL CAMOUFLAGE AND THERMOREGULATION COMPOSITION

(71) Applicant: Stealth Labs, LLC, Roswell, GA (US)

(72) Inventor: Marc Hertel, Roswell, GA (US)

(73) Assignee: Stealth Labs, LLC, Roswell, GA (US)

( * ) Notice: Subject to any disclaimer, the term of this patent is extended or adjusted under 35 U.S.C. 154(b) by 0 days.

(21) Appl. No.: 17/700,315

(22) Filed: Mar. 21, 2022

(65) Prior Publication Data

US 2023/0228924 A1 Jul. 20, 2023

Related U.S. Application Data

(60) Provisional application No. 63/299,851, filed on Jan. 14, 2022.

(51) Int. Cl.
*G02B 5/20* (2006.01)
*G02B 5/26* (2006.01)
(Continued)

(52) U.S. Cl.
CPC .............. *G02B 5/208* (2013.01); *D06M 11/74* (2013.01); *D06M 11/83* (2013.01); *D06M 11/84* (2013.01);
(Continued)

(58) Field of Classification Search
CPC .......... G02B 5/208; G02B 5/206; G02B 5/26; D06M 11/74; D06M 11/83; D06M 11/84; D06M 15/507; H05K 9/0083; B32B 5/273
(Continued)

(56) References Cited

U.S. PATENT DOCUMENTS 3,923,587 A * 12/1975 Porte ................. D04H 3/03
28/240
4,034,375 A 7/1977 Wallin
(Continued)

FOREIGN PATENT DOCUMENTS

CN 111286079 A 6/2020
GB 2463017 A 3/2010
(Continued)

*Primary Examiner* — Jennifer A Boyd
(74) *Attorney, Agent, or Firm* — Gregory Finch; Finch Paolino, LLC

(57) ABSTRACT

Exemplary embodiments of the present disclosure provide a system, apparatus, and methods for producing a high-performance camouflage and thermal management composite fabric textile systems. The systems comprise woven and non-woven composite fabrics consisting of layers for thermal and electromagnetic wave propagation as well as human thermal emission control. The systems incorporate thermal plastic insulation, felt insulation, electromagnetic wave absorption materials, electromagnetic wave propagation and thermal emission control elements, and camouflage pigment patterns. Dots containing encapsulated metallic particulates enable omni-spectral electromagnetic wave and thermal radiation signature manipulation and control as well as cost-effective manufacturing. Single blended textile processed via needle punching produces hair/fur-like protrusions made from a multilayer fabric composition having EM wave and thermal radiation control elements. The protrusions subsequently contain EM propagation and thermal emission control elements on their surfaces for omni-spectral camouflage and detection mitigation. The systems expand the options for meeting the demands of today and future stealth missions.

20 Claims, 12 Drawing Sheets

(51) Int. Cl.
*D06M 11/84* (2006.01)
*D06M 11/83* (2006.01)
*D06M 11/74* (2006.01)
*D06M 15/507* (2006.01)
*H05K 9/00* (2006.01)

(52) U.S. Cl.
CPC .......... *D06M 15/507* (2013.01); *G02B 5/206* (2013.01); *G02B 5/26* (2013.01); *H05K 9/0083* (2013.01)

(58) Field of Classification Search
USPC ........................................................ 442/131
See application file for complete search history.

(56) References Cited

U.S. PATENT DOCUMENTS

| | | | |
|---|---|---|---|
| 6,037,280 A | 3/2000 | Edwards et al. | |
| 6,379,589 B1 | 4/2002 | Aldissi | |
| 6,503,963 B2 | 1/2003 | Toyoda et al. | |
| 6,756,931 B2 | 6/2004 | Mukasa et al. | |
| 7,412,937 B2 | 8/2008 | Stevens et al. | |
| 8,635,846 B2* | 1/2014 | Hendrix | D02G 3/442 57/2 |
| 9,322,953 B2 | 4/2016 | Narimanov | |
| 9,894,817 B2 | 2/2018 | Kagawa | |
| 11,081,802 B2 | 8/2021 | Mejean et al. | |
| 2004/0051082 A1 | 3/2004 | Child et al. | |
| 2009/0111345 A1* | 4/2009 | Panse | A41D 31/085 428/221 |
| 2013/0137324 A1 | 5/2013 | Tang | |
| 2014/0248814 A1* | 9/2014 | Handermann | E04C 2/16 442/326 |
| 2018/0100256 A1* | 4/2018 | Handermann | B32B 7/08 |
| 2019/0017785 A1 | 1/2019 | Morag et al. | |
| 2020/0227833 A1 | 7/2020 | Hiroi et al. | |
| 2021/0119343 A1 | 4/2021 | Fu et al. | |
| 2021/0260850 A1* | 8/2021 | Jin | B32B 5/022 |
| 2021/0324254 A1 | 10/2021 | Li et al. | |

FOREIGN PATENT DOCUMENTS

| | | |
|---|---|---|
| IL | 273905 A | 5/2020 |
| WO | 02080201 A1 | 10/2002 |

\* cited by examiner

OMNI-SPECTRAL CAMOUFLAGE AND THERMOREGULATION COMPOSITION

CROSS-REFERENCE TO RELATED APPLICATIONS

The present application claims the benefit of U.S. Provisional Application Ser. No. 63/299,851, filed on Jan. 14, 2022, and entitled "OMNI-SPECTRAL CAMOUFLAGE AND THERMOREGULATION SYSTEM," the disclosure of which is hereby incorporated in its entirety at least by virtue of this reference.

FIELD

The present disclosure relates to the field of textiles and polymeric systems for use in omni-spectral thermal camouflage and thermal regulation, thermal signal mitigation, transmission, absorption, reflection visible signal breakup and emission control.

BACKGROUND

The protection and survival of troops on the battlefield is a vital aspect of conducting combat operations. Thermal camouflage is one of the most effective ways to increase the protection and survival of troops in what is becoming peer-to-peer level potential conflicts. Thermal camouflage is a method for assimilating into the environment in response to an interrogation wavelength of a detector which may correspond to visible, infrared (IR), and microwave wavelengths. The rapid development of reconnaissance measures, detection, and targeting technologies hinder the ability of troops to operate in a wide spectrum of electromagnetic radiation. It is becoming increasingly necessary to continually advance the effectiveness of various means of thermal camouflage on clothing, in garments, in shelters, sleep systems, camouflage nets and more. This poses a significant challenge, in terms of the properties of the materials used, design optimization, and cost-effective fabrication of modern thermal camouflage and thermal regulation systems to optimize wearable and overhead thermal mitigation textiles that address the current omni-spectral threats on the modern battlefield.

Fabrics are widely used in clothing, uniform, and gear and play a critical role in breaking up visible signature and regulating heat transfer. The normal temperature of the skin body is about 34° C. and the human body releases radiation from the mid-infrared (IR) at a peak propagation of 9.5 µm which can be detected by various heat-sensing systems and thus can compromise stealth. Studies have shown that human skin emits a behavior like that of a near-infrared wavelength black body. Thermal control is a technique developed by designing fabrics that can control the thermal transfer system of the human body temperature. The transfer of heat between the body or mechanical surface and the surrounding climate condition is completely dependent on several main factors such as ambient temperature, composition, conduction, IR reflection, air circulation, average radiant heating, moisture content, and clothing design. On the body, a fabric structure can influence heat and moisture transfer and hence thermal comfort, which can impact field longevity to maintain thermal equilibrium and mission success in cold environments and reflect UV/IR radiation (solar) away from the body or mechanical surface to stay cool (body or equipment) in hot environments.

The control of electromagnetic (EM) waves behavior and thermal emission are becoming increasingly important for stealth applications as the expanded capabilities of thermal detection and targeting technologies increases, as well as the growing threat of peer-to-peer or near peer conflict becomes more prevalent. One of the sectors of developing equipment is the growing demand for NIR and SWIR camouflage has led to the continuous effort to improve full spectrum technologies. Infrared absorption properties in this frequency or wavelength bandwidth as well as detection devices utilizing lasers or scanning devices operating in the IR frequency range from X-ray at 0.01 nm to 10 nm and from 700 to 1500 µm, which require a broken surface signature mitigation to create a mechanical design and absorption replacement to the (environmental) coefficient to affect laser transmission (duplicating the flocked surface of snow and sub-surface diffusion). For another example, on high frequency mitigation, a microwave absorber can effectively absorb electromagnetic wave energy and convert electromagnetic energy into heat. However, conventional electromagnetic wave absorption materials have several drawbacks including heavy weight, reduced durability, rigidity (i.e., lacking in flexibility) and limited efficacy to fixed frequency bands or wavelengths. Composite materials and systems have been devised to meet these challenges. Composite materials allow convenient use on surfaces, good control over mechanical properties, and variation of electromagnetic properties with proper selection of matrix material and methods of manufacture with different inclusions of either dielectric, conductive or ferromagnetic particles. However, high performance omni-spectral materials for camouflage and thermal emission management remains elusive in meeting the demands of today and future stealth missions.

SUMMARY

The following presents a simplified summary of some embodiments of the invention to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

An aspect of the present disclosure is a high-performance camouflage and thermal management composite fabric system. In various embodiments, the composite fabric system comprises one or more composite layers. In various embodiments, the one or more layers comprises a first conductive radar absorption material (RAM) fabric layer and a second thermal emission control layer containing one or more magnetic micro-nanoparticles deposited on the surface of said thermal control layer, enabling electromagnetic wave (EM) sub-surface diffusion (SSD) and retarding human black body radiation propagation. In various embodiments, the one or more magnetic micro-nanoparticles are encapsulated within a polymeric microsphere or coated on one or more surface of one or more polymeric microsphere. In various embodiments, one or more magnetic micro-nanoparticles provide electromagnetic wave propagation control, including but not limited to, electrical conduction, reflection, absorption, transmission and multi-reflection. In various embodiments, one or more spherical polymeric encapsulated magnetic micro-nanoparticles provide EM wave propagation control, including but not limited to conduction, reflection, absorption, transmission, and multi-reflection. The high-performance camouflage and thermal management composite fabric system enables omni-spectral stealth applications.

An aspect of the present disclosure is a high-performance camouflage and thermal management composite fabric system. In various embodiments, the composite fabric system comprises one or more composite layers. In various embodiments, the one or more layers comprises a first fabric layer, a second layer containing at least one magnetite, barium, or hafnium micro-nanoparticle, or combinations thereof, and a third layer containing pigments for sub-surface diffusion (SSD). In various embodiments, the one or more magnetic, barium, or hafnium micro-nanoparticles are encapsulated within a polymeric microsphere or coated on one or more surface of one or more polymeric microsphere. In various embodiments, one or more magnetic, barium, or hafnium micro-nanoparticles provide electromagnetic wave propagation control, including but not limited to subsurface diffusion, conduction, reflection, absorption, transmission, and multi-reflection. In various embodiments, one or more spherical polymeric encapsulated magnetic, barium, or hafnium micro-nanoparticles provide EM wave propagation control, including but not limited to subsurface diffusion, reflection, absorption, transmission, and multi-reflection. The high-performance camouflage and thermal management composite fabric system enables omni-spectral stealth applications.

An aspect of the present disclosure is a high-performance camouflage and thermal management composite fabric system. In various embodiments, the composite fabric system comprises one or more composite layers. In various embodiments, the one or more layers comprises a first thermal insulation fabric layer, a conductive radar absorption material (RAM) fabric layer, a third layer comprising one or more polymeric microsphere or "dot," and a fourth layer comprising one or more camouflage pigment pattern. In various embodiments, the thermal insulation fabric layer comprises at least one ceramic particle embedded within rubber or thermoplastic. In various embodiments, the one or more dots comprises at least one metallic micro-nanoparticle encapsulated within a dot. In various embodiments, a metallic micro-nanoparticle comprises a magnetic, superparamagnetic, or diamagnetic iron oxide micro-nanoparticle, including but not limited to, magnetite, hematite, combinations thereof, and the like. In various embodiments, the thermal insulation layer provides thermal emission control. In various embodiments, one or more magnetic iron oxide micro-nanoparticles provide EM wave propagation control, including but not limited to conduction, reflection, absorption, transmission, and multi-reflection. In various embodiments, one or more spherical polymeric encapsulated magnetic micro-nanoparticles provide EM wave propagation control, including but not limited to conduction, reflection, absorption, transmission, and multi-reflection. The high-performance camouflage and thermal management composite fabric system enables omni-spectral stealth applications.

An aspect of the present disclosure is a high-performance camouflage and thermal management composite fabric system. In various embodiment, the composite fabric system comprises one or more composite layers. In various embodiments, the one or more layers comprises a first fabric layer, a conductive radar absorption material (RAM) layer, a third RAM micro-nanoparticle layer comprising one or more magnetite or barium or hafnium particle or "dot," and a fourth layer comprising one or more camouflage pigment pattern. In various embodiments, the one or more dots comprises at least one metallic micro-nanoparticle encapsulated within a dot. In various embodiments, the RAM micro-nanoparticle layer comprises a magnetic, superparamagnetic, or diamagnetic iron oxide micro-nanoparticle, including but not limited to, magnetite, hematite, combinations thereof, and the like. In various embodiments, the RAM microparticle layer comprises barium or hafnium. In various embodiments, the RAM microparticle layer comprises various ratio of magnetic iron oxide and barium and hafnium. In various embodiments, the RAM micro-nanoparticle layer provides EM wave propagation control, including but not limited to subsurface diffusion, conduction, reflection, absorption, transmission, and multi-reflection. The high-performance camouflage and thermal management composite fabric system enables omni-spectral stealth applications.

An aspect of the present disclosure is a high-performance camouflage and thermal management composite fabric system. In various embodiments, the composite fabric system comprises one or more composite layers. In various embodiments, the one or more layers comprises a first thermal insulation fabric layer, a conductive radar absorption material (RAM) fabric layer, a third layer comprising said first thermal insulation fabric layer, and a fourth layer comprising one or more defined surface area of the third layer, further comprising one or more dots and camouflage pigment patterns. In one embodiment, at least one defined surface area of the third layer comprises camouflage pigment pattern printed on top of one or more dot. In another embodiment, at least one defined surface area of the third layer comprises one or more dot applied on top of the printed camouflage pigment pattern. In various embodiments, the thermal insulation fabric layers, first and third, comprise at least one ceramic, aluminum, tin, carbon, graphite, graphene, or copper particle or flakes embedded within rubber or thermoplastic. In various embodiments, the one or more dots comprises at least one metallic micro-nanoparticle encapsulated within a dot. In various embodiments, a metallic micro-nanoparticle comprises a magnetic, superparamagnetic, or diamagnetic iron oxide micro-nanoparticle, including but not limited to, magnetite, hematite, combinations thereof, and the like. In various embodiments, the thermal insulation layer provides thermal emission control. In various embodiments, one or more magnetic iron oxide micro-nanoparticles provide EM wave propagation control, including but not limited to conduction, reflection, absorption, transmission, and multi-reflection. In various embodiments, one or more spherical polymeric encapsulated magnetic micro-nanoparticles provide EM wave propagation control, including but not limited to conduction, reflection, absorption, transmission, and multi-reflection. The high-performance camouflage and thermal management composite fabric system enables omni-spectral stealth applications.

An aspect of the present disclosure is a high-performance thermal camouflage and thermal management composite fabric system. In various embodiments, the composite fabric system comprises one or more composite layers. In various embodiments, the one or more layers comprises a woven, non-woven, knit substrate of optimal thickness composition and Denier to apply a thermal stealth coating matrix. This substrate is stealth coated with a polymer/ink matrix through various means, including but not limited to, screen printing, pad coating, dip coating, knife over edge coating and the like. In various embodiments, a first conductive thermal reflective layer is printed on the surface of the substrate in a Faraday or modified broken or random pattern followed by a second infrared absorbs material (IRAM) polymer layer that is also printed in a Faraday cage pattern. A third thermal emission control layer containing one thermal/electromagnetic broken surface of dots is then printed on surface of the second IRAM layer. The dots may be modified from uniform to semi-uniform surface dots, to create broken irregular surface disruptions, resembling for example the surface of paper through a needling process. In various embodiments, one or more said dot contains magnetic micro-nanoparticles deposited on the surface of infrared absorbing material (IRAM) polymer coating layer, enabling EM wave diffusion and a causal sub-surface diffusion (SSD), and in combination with the first- and second-layers retard or control human or mechanical black body radiation, emission, or propagation. In various embodiments, the outermost layer (surface) performs a diffusion function with one or more magnetic micro-nanoparticles encapsulated within a polymeric thermoplastic dot above or below the surface of the IRAM or coated on or in the IRAM itself In various embodiments, one or more magnetic micro-nanoparticles provide EM wave propagation control, including but not limited to, electrical conduction, reflection, absorption, transmission, and multi-reflection. In various embodiments, one or more spherical polymeric encapsulated magnetic micro-nanoparticles provide EM wave propagation control, including but not limited to diffusion, conduction, reflection, absorption, transmission, and multi-reflection. The high-performance thermal camouflage and thermal management composite fabric system on the surface of woven, knit, felt, nonwoven fabrics or within said textile systems enables omni-spectral stealth applications.

An aspect of the present disclosure is a high-performance thermal camouflage and thermal management composite fabric system. In various embodiments, the composite fabric system comprises one or more composite layers. In various embodiments, the one or more layers comprises a first fabric layer, a second layer containing at least one reflective layer closest to the fabric layer of aluminum, copper, tin, nickel, or combinations thereof, and a third layer containing Infrared absorbing material (IRAM) such as conductive carbon, graphite, graphene, or any combination thereof printed in a Faraday cage pattern on solid surface substrates or coated on mesh in a similar pattern. In various embodiments, the fourth layer contains one or more paramagnetic micro-nanoparticles encapsulated within a polymeric microsphere dot or coated on or in the surface of the IRAM. In various embodiments, one or more paramagnetic, micro-nanoparticles in the polymeric microsphere printed dots contain elements such as iron oxide, aluminum oxide, nickel and copper to provide electromagnetic wave propagation control, including but not limited to aiding subsurface diffusion, conduction, reflection, absorption, transmission, and multi-reflection on the surface of the system thus aiding the IRAM polymeric absorption function below and ultimately the reflection function of the base level. In various embodiments, one or more spherical polymeric dots encapsulating magnetic, barium sulfide, or hafnium micro-nanoparticles provide EM wave propagation control, including but not limited to subsurface diffusion aid, Xray mitigation (opacity), reflection, absorption, transmission, and multi-reflection. The high-performance thermal camouflage and thermal management composite fabric system enables omni-spectral stealth applications in this configuration or aided in insulative function with the Extruded Felt IR Insulation (EFIRI).

An aspect of the present disclosure is a high-performance thermal camouflage and thermal management composite fabric system. In various embodiments, the thermal insulation fabric layer comprises at least one or two layers of nonwoven textile and/or a needled felt. In various embodiments, IRAM is applied to the felt optionally including a metallic micro-nanoparticle comprising a magnetic, superparamagnetic, or diamagnetic iron oxide micro-nanoparticle, including but not limited to, ferrite metal iron oxide, aluminum oxide, nickel, copper, titanium oxide, magnetite, hematite, combinations thereof, and the like, as well as the addition of a reflective ink or polymer such as Aluminum flake. In this embodiment, the EFIRI thermal insulation layer provides thermal emission control and in the process of needling to another non-woven or composite fabric mesh or scrim has individual hair-like fibers containing stealth IRAM polymers now perpendicular above the surface at the nano to micro level duplicating a flocking style process of broken surface IR mitigation such as the hair of an animal in nature. Stealth polymers attached to individual fibers and pulled out into the hair or "fur-like" structure forming the EFIRI duplicate the cuticle or keratin function of hair in humans and animals with subsequent subsurface diffusion like melanin coloring a clear hair fiber from within. This process of subsurface diffusion on a flocking style nano hair environment aide greatly in thermal mitigation at multiple frequencies from XRAY-Laser to NIR and SWIR to radar and microwave. In various embodiments, one or more magnetic iron oxide micro-nanoparticles provide EM wave propagation control, including but not limited to conduction, reflection, absorption, transmission, and multi-reflection. In various embodiments, the EFIRI is coated with one or more nonwoven fabrics containing IRAM and stealth "dots" spherical or broken polymeric encapsulated magnetic micro-nanoparticles provide EM wave propagation control, including but not limited to conduction, reflection, absorption, transmission, and multi-reflection. The high-performance thermal camouflage and thermal management composite fabric system enables omni-spectral stealth applications.

An aspect of the present disclosure is a high-performance thermal camouflage and thermal management composite fabric system. In various embodiments, the composite fabric system comprises one or more composite layers. An aspect of the present disclosure is a high-performance thermal camouflage and thermal management non-woven composite fabric system. In various embodiments, the non-woven composite fabric system comprises one or more composite layers in conjunction with one or more composite or natural fiber felt layers. In various embodiments, the one or more layers comprises a first composite fabric substrate, a second thermal insulation felt layer, and optionally one or more non-woven or mesh layer. In various embodiments, the said layers are manufactured into a single blended textile or fabric for producing, including but not limited to, a stealth insulation in garments tents and shelters, wearable stealth garment, sleep systems, an Ultra-Lightweight Camouflage Net System (ULCANS), and the like. In various embodiments said first composite fabric substrate comprises one or more EM wave propagation and thermal emission control elements. In various embodiments, the felt layer comprises various fabric composition of varying characteristics and properties. In various embodiments, a third layer comprises a mesh treated with at least one EM wave propagation control element. In certain embodiments, the felt layer is sandwiched between said first composite fabric substrate containing IRAM and "dots" and a third layer of similar and the single blended textile is processed via needle punching to produce one or more hair/fur-like protrusions on one or more external surface areas of the single blended textile or fabric. The resulting protrusions subsequently incorporate one or more EM wave propagation and thermal emission control elements of said first and third layer from needle punching. The resulting single blended 3-dimensional textile provides EM wave propagation and thermal emission control capabilities, including but not limited to visible wavelength signature breakup (hair like function), flocking function of nano hair absorption/diffusion of IR Search and Track and Targeting Systems targeting, EM conduction, reflection, absorption, transmission, multi-reflection, and thermal conduction, convection, and radiometry functions. The high-performance camouflage and thermal management non-woven composite fabric system enables omni-spectral stealth applications.

An aspect of the present disclosure is to provide high performance omni-spectral camouflage and thermal emission management textile systems capable of meeting the demands of today and future stealth missions. The systems comprise woven and non-woven composite fabrics consisting of layers for thermal emission control and EM wave propagation control as well as human thermal comfort control. Propagation and emission control are afforded by the incorporation of various elements, including dots containing encapsulated metallic micro-nanoparticles and fabric hair/fur-like protrusion structures created using needling of felt to generate a 3-dimensional textile. The fabric textile systems enable mitigation of omni-spectral detection for stealth applications.

Further aspects of the present disclosure provide for a stealth material composition comprising a substrate layer comprising a woven or a non-woven fabric; a first layer disposed on a surface of the substrate layer, the first layer comprising a conductive thermal reflective coating, wherein the conductive thermal reflective coating comprises aluminum flake disposed on the surface of the substrate layer; and a second layer disposed on the first layer, the second layer comprising an infrared absorbing material coating, wherein the infrared absorbing material coating comprises graphite and a polymer binder.

In accordance with certain embodiments, the stealth material composition further comprises a third layer disposed on the second layer, wherein the third layer comprises a thermal emission control layer. In accordance with certain embodiments, the aluminum flake is disposed on the surface of the substrate layer according to one or more pattern to comprise a stealth coating matrix. In accordance with certain embodiments, the one or more pattern is selected from the group consisting of ordered, periodic, Faraday cage, modified broken, and random. In accordance with certain embodiments, the third layer comprises a plurality of dots comprising a thermoplastic or polyester resin. In accordance with certain embodiments, the plurality of dots comprises one or more particles encapsulated in each dot in the plurality of dots. In accordance with certain embodiments, the one or more particles comprise at least one particle selected from the group consisting of aluminum oxide particles, ferrite metal particles, copper particles, manganese particles, photonic crystal particles, barium sulfide particles, and graphite particles.

Further aspects of the present disclosure provide for a stealth material composition comprising a substrate layer comprising a woven or a non-woven fabric substrate; a first layer disposed on a surface of the substrate layer, the first layer comprising a conductive thermal reflective coating, wherein the conductive thermal reflective coating comprises aluminum flake disposed on the surface of the substrate layer, a second layer disposed on the first layer, the second layer comprising an infrared absorbing material coating, wherein the infrared absorbing material coating comprises graphite and a polymer binder; and one or more protrusions disposed on at least one surface of the stealth material composition, wherein the one or more protrusions comprise one or more fibers from each of the substrate layer, the first layer and the second layer.

Still further aspects of the present disclosure provide for a stealth material composition comprising a felt layer; a substrate layer disposed on the felt layer and comprising a woven or a non-woven fabric; a first layer disposed on the substrate layer, the first layer comprising a conductive thermal reflective coating, wherein the conductive thermal reflective coating comprises aluminum flake disposed on the surface of the substrate layer; and a second layer disposed on the first layer, the second layer comprising an infrared absorbing material coating, wherein the infrared absorbing material coating comprises graphite and a polymer binder.

In accordance with certain embodiments, the felt layer comprises a fabric composition comprising wool fiber or fur fiber. In accordance with certain embodiments, the stealth material composition further comprises one or more protrusions disposed on at least one surface of the stealth material composition, wherein the one or more protrusions comprise one or more fibers from each of the felt layer, the substrate layer, the first layer and the second layer. In accordance with certain embodiments, the one or more protrusions are formed by needle punching the stealth material composition to pull out the one or more fibers from each of the felt layer, the substrate layer, the first layer and the second layer. In accordance with certain embodiments, the felt layer has a thickness in the range of 0.5 millimeters to 1.5 millimeters. In accordance with certain embodiments, the felt layer comprises a fabric composition comprising a polyacrylonitrile fiber and a silica-based fiber.

BRIEF DESCRIPTION OF DRAWINGS

The above and other objects, features and advantages of the present disclosure will be more apparent from the following detailed description taken in conjunction with the accompanying drawings, in which.

DETAILED DESCRIPTION

Figure 1:
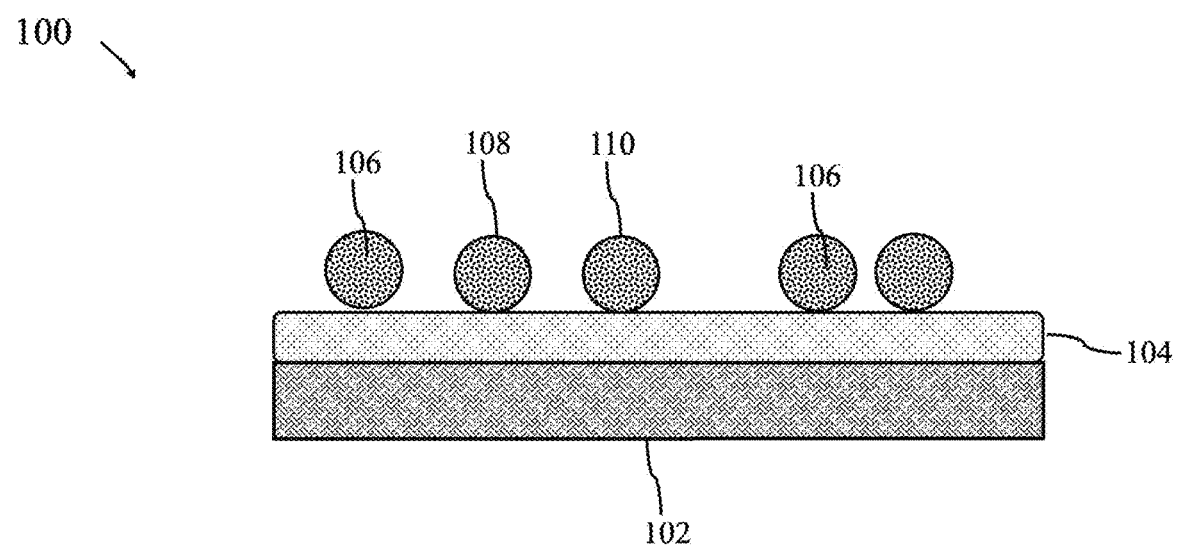
FIG. 1 is a pictorial of a camouflage and thermal management composite fabric system, in accordance with certain aspects of the present disclosure.

It should be appreciated that all combinations of the concepts discussed in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the concepts disclosed herein.

It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes. The present disclosure should in no way be limited to the exemplary implementation and techniques illustrated in the drawings and described below.

Where a range of values is provided, it is understood that each intervening value, to the tenth of the unit of the lower limit unless the context clearly dictates otherwise, between the upper and lower limit of that range and any other stated or intervening value in that stated range is encompassed by the invention. The upper and lower limits of these smaller ranges may independently be included in the smaller ranges, and are also encompassed by the invention, subject to any specifically excluded limit in a stated range. Where a stated range includes one or both endpoint limits, ranges excluding either or both of those included endpoints are also included in the scope of the invention.

As used herein, the term "includes" means includes but is not limited to, the term "including" means including but not limited to. The term "based on" means based at least in part on.

As used herein, the term "omni-spectral" means but not limited to the wavelength range of X-ray, UV, visible, near infrared (NIR), infrared (IR), SWIR, LWIR, far IR, millimeter, radar radio waves (i.e., $10^{-10}$ to $10^8$ meter).

As used herein, the term "black body" radiation means the thermal electromagnetic radiation within or surrounding a body in thermodynamic equilibrium with its environment, emitted by a black body (an idealized opaque, non-reflective body).

As used herein the term "stealth coating" means but not limited to a combination of one, two, or more layers of stealth polymer ink applications to the surface of a substrate.

As used herein, "felt" means a textile material that is produced by, but not limited to, matting, condensing, and pressing fibers together.

As used herein, "exemplary" means serving as an example or illustration and does not necessarily denote ideal or best.

Exemplary embodiments of the present disclosure provide a system, apparatus, and methods for producing a high-performance camouflage and thermal management composite fabric textile systems. The systems comprise woven and non-woven composite fabrics consisting of layers for thermal and electromagnetic wave propagation as well as human thermal emission control. The systems incorporate thermal plastic insulation, felt insulation, electromagnetic wave absorption materials, electromagnetic wave propagation and thermal emission control elements, and camouflage pigment patterns. Dots containing encapsulated metallic particulates enable omni-spectral electromagnetic wave manipulation and control as well as cost-effective manufacturing. Single blended textile processed via needle punching produces hair/fur-like protrusions made from a multilayer fabric composition having EM wave and thermal radiation control elements. The protrusions subsequently contain EM propagation and thermal emission control elements on their surfaces for omni-spectral camouflage and detection mitigation. The systems expand the options for meeting the demands of today and future stealth missions.

Reconnaissance measures such as radar use an emitting element to transmit a radiation beam. When such beams encounter an object, they are reflected by the object and returned to the radar. The radar receiver receives the reflected radiation, which is subjected to time analysis (to determine the distance to the detected object) and amplitude-phase analysis (to determine the type of object detected). This mode of operation of radar devices means that the only effective countermeasure is to minimize reflected radiation, resulting in either a lack of detection or, should detection occur, incorrect identification of the object. It is generally accepted that radars operate in the range of electromagnetic radiation, mostly in the centimeter and millimeter wave spectrum. However, battlefield radar and tracking radars work in different wavelengths, from 1 to 20 GHz, 35 GHz, and 94 GHz.

Camouflage in the radar range focuses on at least two aspects: reducing the radar cross section (RCS) of objects so that a minimal proportion of the radiation emitted by the radar returns to it as the result of being reflected from the object; deformation/blurring of the radar signature of the object camouflaged to eliminate or change the details of the radar signature which allow recognition/identification of the object. Another approach is to use microwave absorbers.

The absorption of electromagnetic (EM) wave radiation and propagation is a process by which the energy of an EM wave is turned off and then transformed into other energies by interference, which EM wave cannot reflect or transmit through material. Ideal EM wave absorbing materials should have two basic properties: (1) the intrinsic impedance of the material is equal to the impedance of the free space (impedance matching) and (2) the EM wave in the material is rapidly attenuated. These conditions require strong magnetic and/or dielectric loss exhibition.

Electromagnetic energy/wave consists of a magnetic (H-field) and electric (E-field) component perpendicular to each other and propagates at right angles to the plane containing the two components. The ratio of E to H is defined as the wave impedance ($Z_w$, in ohms $\Omega$) and depends on the type of source and the distance from the source. Large impedances characterize electric fields and small impedances characterize magnetic fields. Far from the source, the ratio of E to H remains constant and equal to 377 $\Omega$, the intrinsic impedance of free space.

A radar absorbing material (RAM) reduces the energy reflected back to the radar by means of absorption. The main requirements are an effective EM wave impedance and good attenuation at the surfaces of a RAM that result in a good match for the incoming signal once it penetrates the material. RAMs can be categorized into two types: dielectric and magnetic absorbers, which means that the absorption is primarily due to their dielectric and magnetic characteristics, respectively.

The amount of attenuation offered by an absorber depends on three mechanisms. The first is usually a reflection of the wave from the shield/absorber. The second is an absorption of the wave into the absorber as it passes through the absorber. The third is due to the re-reflections, i.e., the multiple reflections of the waves at various surfaces or interfaces (e.g., air, material) in the shield/absorber. The reflection loss is a function of the ratio $S_r/M_r$, whereas the absorption loss is a function of the product $S_r$ times $M_r$, where $S_r$ is the electrical conductivity of the absorber relative to copper and $M_r$ is the magnetic permeability of the shield/absorber relative to free space. The EMI shielding/absorption efficiency (SE), reported as reduction of transmitted wave power, includes the shielding effects due to absorption, reflection, and multiple reflections. Due to multiple reflections inside of a shielding/absorbing material, there can also be after-effects like secondary reflection and secondary transmission.

The absorption by the dielectric materials depends on dielectric loss mechanisms, such as electronic/atomic polarization, orientation (dipolar) polarization, ionic conductivity, and interfacial or space charge polarization. Magnetic loss mechanisms include hysteresis loop (from irreversible magnetization, which is negligible in a weak applied field), domain wall resonance (which usually occurs in the frequency range 1-100 MHz), Natural Resonance, and Eddy current losses. According to Poynting's theorem, there is a directional energy flux density of an EM wave (Poynting vector) that is defined as the cross product of the magnetic field vector and the electric field vector. This means that attenuation of EM waves requires not only electronic contribution, but magnetic as well. However, both dielectric and magnetic materials have relatively low absorption when they are used independently. Therefore, it is ideal to enhance absorption characteristics when dielectric materials are coated or blended with magnetic micro-nanomaterials, such as transition metals or their ferrites. Ferrites are considered the best magnetic material for electromagnetic wave absorbers due to their excellent magnetic and dielectric properties.

Polymer fabrics or matrices are generally non-magnetic and do not make any magnetic contribution to EM wave attenuation. The incorporation of magnetic particles allows the increase of specific surface area for electromagnetic interaction and conduction. Different strategies have been employed for the incorporation of ferromagnetic components into polymer composites for EMI shielding. Ferromagnetic nanoparticles not only reduce the front face impedance mismatch, but also increase absorption of any incident EM wave. The enhanced absorption is a resultant of the ferromagnetic resonance as determined by the anisotropy coefficient, damping parameter, saturation magnetization, and particle shape. These properties are affected by moving from bulk material to micro and nanoparticle sizes. The damping parameter due to surface effects increases as the particle diameter decreases and can even increase as much as an order of magnitude as compared to bulk material. Surface anisotropy is also inversely dependent on the particle size, particularly at diameters below one hundred nanometers. Nanosized ferromagnetic inclusions are also important for microwave absorbers since at dimensions well below the skin depth of the composite, EM waves are fully able to penetrate the particle. This entire particle contribution can be significant for particularly high magnetic satu-ration ferrites. Ferrites exhibit good biocompatibility, strong superparamagnetic property, low toxicity, high adsorption ability, and easy preparation procedures. The multiple reflections in which EM waves reflect at multiple interfaces in a shielding/absorbing material can make significant contributions to overall shielding ability. In addition, the inclusion of air-filled pores has two important effects relating to EMI shielding. First, ultra-high porosity foams exhibit low permittivity ensuring penetration of most incident radiation due to decreases in the interfacial impedance gap. Second, upon penetration into the shielding material, the attenuation of EM waves is assisted by scattering between the cell walls and metallic fillers. However, a high concentration/percent (>50%) of nanofillers is usually required to construct an effective conductive network, causing the nanofillers to agglomerate and reducing the performance, such as flexibility and mechanical strength.

A useful aspect of metal oxide materials (e.g., iron oxide, ferrites, hafnium) is their optical properties. The optical properties of nanomaterials or micro-nano particles strongly depend on parameters such as feature size, shape, surface characteristics, and doping. Spectral absorption features observed in the visible to short-wave infrared wavelength region result from several distinct processes. In the spectral range from 0.4 to approximately 1.2 micrometer (μm), absorption features are produced mainly by energy level changes in the valence electrons of transition metals, by paired excitations of metal cations, or by charge transfer between metal cations and their associated ligands. Mixed valence iron oxides such as magnetite exhibit thermally induced electron delocalization between adjacent ferrous ($Fe^{2+}$) and ferric ($Fe^{3+}$) ions, and electronic transitions assigned to intervalence charge transfer (IVCT) transitions in the visible and near-IR region. IVCT transitions are transitions in which an electron, through optical excitation, is transferred from one cation to a neighboring cation. Compounds containing an element in two different oxidation states, mixed valence compounds, often show intense absorption in the visible region which can be attributed to IVCT transitions. Ferric iron commonly exhibits an intense absorption band centered in the ultraviolet (UV) region near 0.25 μm related to charge transfer between ferric cations and adjacent oxygen anions. The strong absorption edge between 0.4 and 0.6 μm may result from paired excitations between magnetically coupled ferric cations. Superimposed on these intense spectral features are absorption bands related to energy level changes in the valence electrons; these are known as crystal field transitions. Ferrous iron ($Fe^{2+}$) also produces crystal field transitions, and these are positioned at somewhat different wavelengths from ferric iron ($Fe^{3+}$). Most common are broad absorption bands in the 0.9 to 1.1 μm wavelength range related to spin-allowed transitions. Molecular vibration processes generate absorption features in the SWIR (1.3-2.5 μm) wavelength range. Other common absorption features in the SWIR wavelength range include 2.18-2.22 μm bands related to Al—O—H combination bands in aluminous materials, and 2.25-2.38 μm features related to Fe—O—H combination bands. In the mid- and far-IR, away from inter-band transitions, coupling to collective oscillations of free-carriers, called plasmons, and vibrations of the crystal lattice in polar materials can significantly affect the permittivity of a material. Hafnium dioxide ($H_fO_2$), the most stable form, is a polar crystal with strong absorption from the IR active optical phonon modes.

An emerging approach to absorbance dominated EM shielding/absorption is the use of conductive polymer composite foams. Foams, highly dependent on their unique porous morphology, exhibit lower density, lower percolation thresholds, and higher EMI shielding efficiency (SE) that is largely dominated by absorption. The porous morphology decreases the impedance mismatch between air and the shield allowing a larger portion of the incident EM wave to penetrate the shield where it can be absorbed and dissipated as well as increasing the number of scattering events or sub surface diffusion (SSD). These foamed polymer composites have shielding characteristics that are highly dependent on the morphology of the finished foam which is highly sensitive to the specific conditions of the foaming process. Foamed polymer composites have shielding characteristics that are highly dependent on the morphology of the finished foam, which is in turn highly sensitive to the specific conditions of the foaming process. The development of optimized conductive polymeric fabric composite is a complex process that requires the screening of many different factors including material compositions, temperature, reaction time, blowing agent, and depressurization rate. However, the general properties of these polymers, such as low heat-resistance, poor flame retardancy, and high smoke generation negates their use in camouflage systems.

The design of an absorption dominated EM absorbing fabric system requires a few key material properties that need to be controlled such as the lowering of front face impedance mismatch, and the presence of dissipation pathways inside the material through the addition of magnetic or conductive fillers. The impedance for air is 1 and materials that have relative impedances that are closer to 1 exhibit a reduction front face reflection. Controlling impedance mismatch while simultaneously ensuring there are enough pathways for EM dissipation is a challenge. To lower material impedance, one can use lower conductivity materials as well as the addition of magnetic components that increase the permeability. The addition of magnetic material can also increase the magnetic loss tangent, further contributing to the absorption of incident EM radiation. The ideal composition for a conductive polymer composite fabric depends heavily on several factors including filler morphology, filler size, filler-matrix interactions, quality of filler dispersion, etc. In the case of conductive polymer composite with high filler loading, the filling process is very difficult, and the metallic fillers are easy to aggregate due to the extremely high specific surface area of metallic fillers.

An aspect of the present disclosure is a high-performance camouflage and thermal management composite fabric system incorporating the features of an optimized omni-spectral EM wave absorbers containing porous morphology and metallic micro-nanofillers for impedance matching and thermal control.

Referring now to FIG. 1, a pictorial 100 of a camouflage and thermal management composite fabric system is shown, according to various embodiments. In various embodiments, the composite fabric system comprises one or more composite layers. In various embodiments, the one or more layers comprises a first conductive radar absorption material (RAM) fabric layer 102 and second thermal emission control layer 104 and one or more magnetic micro-nanoparticles 106, deposited on the surface of thermal emission control layer 104, enabling electromagnetic wave (EM) sub surface diffusion (SSD). In various embodiments, the RAM fabric layer 102 comprises a porous mesh containing conductive carbon or graphite. In various embodiments, the one or more magnetic micro-nanoparticles 106 are encapsulated within a polymeric microsphere 108 or coated on one or more surface 110 of one or more polymeric microsphere. In various embodiments, magnetic micro-nanoparticles 106 can include, but are not limited to, garnets, spinel ferrites, hexagonal ferrites, multiferroic materials, magneto-dielectric nanocomposites, high-permittivity ferromagnetic materials, iron oxide, magnetite ($Fe_3O_4$), hematite ($\alpha$-$Fe_3O_2$), or maghemite ($\gamma$-$Fe_2O_3$), combinations thereof, and the like. In various embodiments, one or more magnetic micro-nanoparticles 106 provide EM wave propagation control, including but not limited to electrical conduction, reflection, absorption, transmission, and multi-reflection. In various embodiments, one or more spherical polymeric encapsulated magnetic micro-nanoparticles 106 provide EM wave propagation control, including but not limited to conduction, reflection, absorption, transmission, and multi-reflection. The high-performance camouflage and thermal management composite fabric system enables omni-spectral stealth applications.

Figure 2:
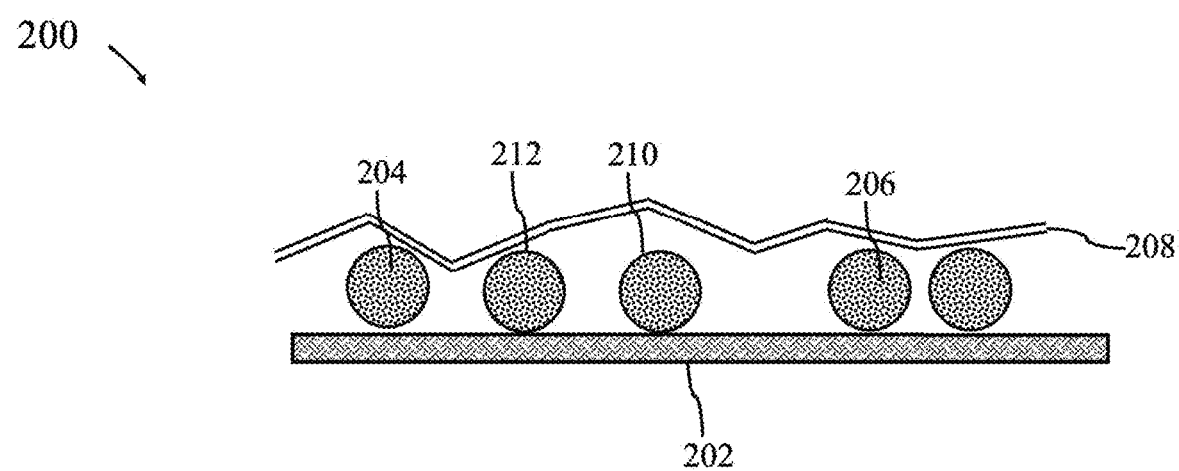
FIG. 2 is a pictorial of an alternative embodiment of camouflage and thermal management composite fabric system, in accordance with certain aspects of the present disclosure.

Referring now to FIG. 2, a pictorial 200 of another camouflage and thermal management composite fabric system is shown, according to various embodiments. In various embodiments, the composite fabric system comprises one or more composite layers. In various embodiments, the one or more layers comprises a first fabric layer 202, a second layer containing at least one magnetite 204 or barium 206 particle, or combinations thereof, and a third layer 208 containing pigments for SSD. In various embodiments, the one or more magnetic micro-nanoparticles 204 or barium 206 microparticles are encapsulated within a polymeric microsphere 210 or coated on one or more surface 212 of one or more polymeric microsphere. In various embodiments, one or more magnetic 204 micro-nanoparticles or barium 206 microparticles provide EM wave propagation control, including but not limited to subsurface diffusion, conduction, reflection, absorption, transmission, and multi-reflection. In various embodiments, one or more spherical polymeric encapsulated magnetic or barium micro-nanoparticles 210 provide EM wave propagation control, including but not limited to subsurface diffusion, reflection, absorption, transmission, and multi-reflection. The high-performance camouflage and thermal management composite fabric system enables omni-spectral stealth applications.

Figure 3:
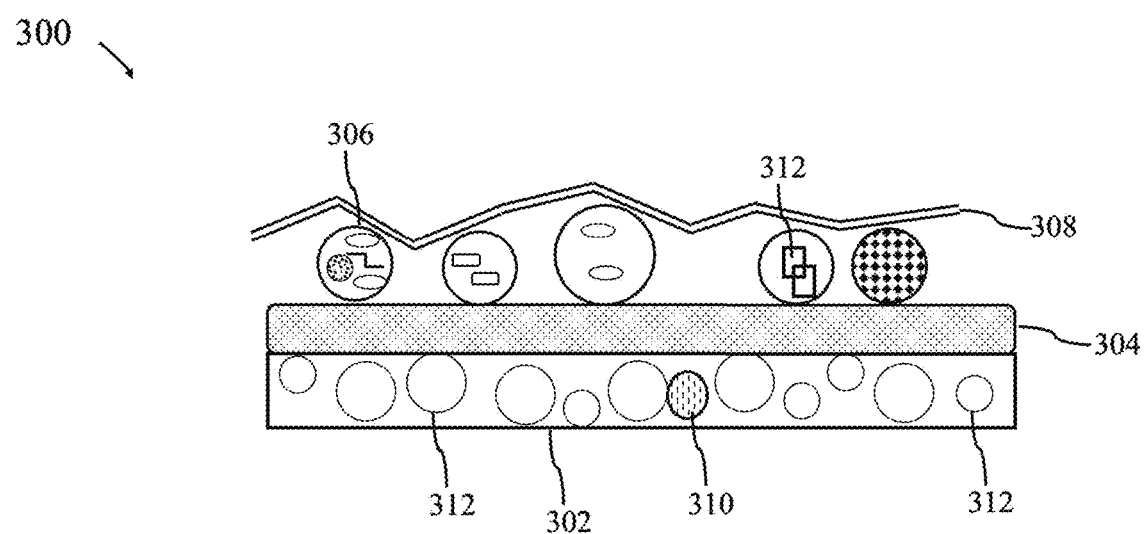
FIG. 3 is a pictorial of an alternative embodiment of camouflage and thermal management composite fabric system, in accordance with certain aspects of the present disclosure.

Referring now to FIG. 3, a pictorial 300 of another camouflage and thermal management composite fabric system is shown, according to various embodiments. In various embodiments, the composite fabric system comprises one or more composite layers. In various embodiments, the one or more layers comprises a first thermal insulation fabric layer 302, a conductive radar absorption material (RAM) fabric layer 304, a third layer comprising one or more polymeric microsphere 306 or "dot," and a fourth layer comprising one or more camouflage pigment pattern 308. In various embodiments, the thermal insulation fabric layer 302 comprises at least one ceramic particle 310 embedded within a rubber or thermoplastic making up layer 302. In various embodiments, insulation layer 302 comprises 10% rubber or 10% thermoplastic and 10-20% ceramic particles. In various embodiments, ceramic particle 310 is approximately 5 micrometers($\mu$m) in diameter. In various embodiments, the one or more dots 306 comprises at least one metallic micro-nanoparticle 312, preferably a magnetic iron oxide particle, encapsulated within a dot. In various embodiments, a metallic micro-nanoparticle 312 comprises a magnetic, superparamagnetic, or diamagnetic iron oxide microparticle, including but not limited to; garnets, spinel ferrites, hexagonal ferrites, multiferroic materials, magneto-dielectric nanocomposites, high-permittivity ferromagnetic materials, iron oxide, magnetite ($Fe_3O_4$), hematite ($\alpha$-$Fe_3O_2$), or maghemite ($\gamma$-$Fe_2O_3$), combinations thereof, and the like.

In various embodiments, the thermal insulation layer 302 provides thermal emission control. In various embodiments, thermal property is afforded by using binder doped with a blowing agent to create one or more air pockets. In various embodiments, thermal insulation layer 302 comprises one or more porous structure 312 of varying diameters. In various embodiments, porous structure 312 comprises non-limiting pore sizes 0.3 millimeter (mm) to 1.5 mm. In various embodiments, one or more magnetic iron oxide micro-nanoparticles 312 provide EM wave propagation control, including but not limited to conduction, reflection, absorption, transmission, and multi-reflection. In various embodiments, one or more magnetic iron oxide micro-nanoparticles 312 provide human thermal heat propagation control, including but not limited to, black body radiation propagation. In various embodiments, one or more spherical polymeric encapsulated magnetic micro-nanoparticles provide EM wave propagation control, including but not limited to conduction, reflection, absorption, transmission, and multi-reflection. The high-performance camouflage and thermal management composite fabric system enables omni-spectral stealth applications.

Figure 4:
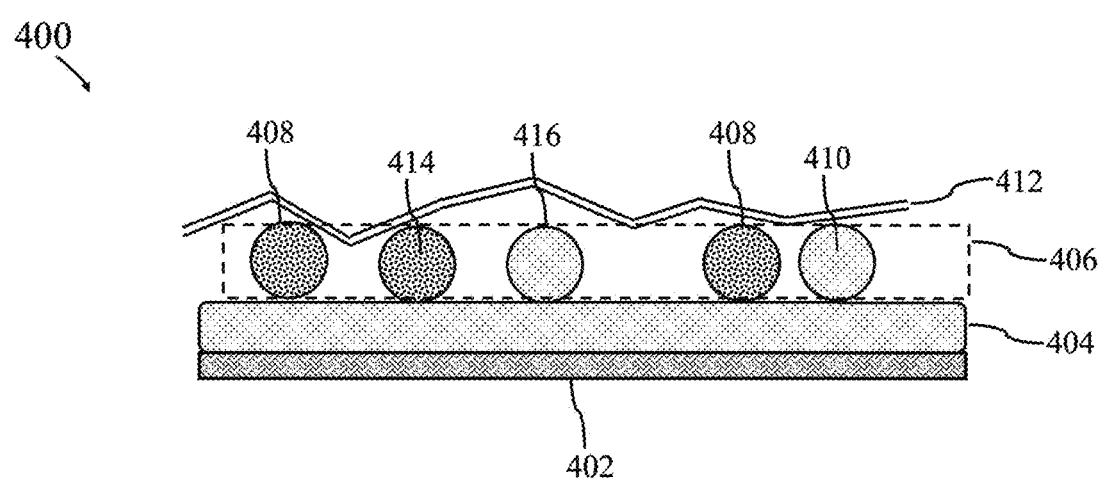
FIG. 4 is a pictorial of an alternative embodiment of camouflage and thermal management composite fabric system, in accordance with certain aspects of the present disclosure.

Referring now to FIG. 4, a pictorial 400 of another camouflage and thermal management composite fabric system is shown, according to various embodiments. In various embodiments, the composite fabric system comprises one or more composite layers. In various embodiments, the one or more layers comprises a first fabric layer 402, a conductive radar absorption material (RAM) layer 404, a third RAM microparticle layer 406 comprising one or more magnetite 408 or barium particle 410 or "dot," and a fourth layer 412 comprising one or more camouflage pigment pattern. In various embodiments, the one or more dots 408, 410 comprises at least one metallic micro-nanoparticle 414 encapsulated within a dot. In various embodiments, the RAM micro-nanoparticle layer comprises a magnetic, superparamagnetic, or diamagnetic iron oxide microparticle, including but not limited to; garnets, spinel ferrites, hexagonal ferrites, multiferroic materials, magneto-dielectric nanocomposites, high-permittivity ferromagnetic materials, iron oxide, magnetite ($Fe_3O_4$), hematite ($\alpha$-$Fe_3O_2$), or maghemite ($\gamma$-$Fe_2O_3$), combinations thereof, and the like. In various embodiments, the RAM microparticle layer 406 comprises barium particle 410. Barium particle 410 may be encapsulated with a spherical polymeric particle 416. In various embodiments, the RAM microparticle layer 406 comprises various ratio of magnetic iron oxide 408 and barium 416 particles. In various embodiments, the RAM microparticle layer 406 provides EM wave propagation control, including but not limited to subsurface diffusion, conduction, reflection, absorption, transmission, and multi-reflection. The high-performance camouflage and thermal management composite fabric system enables omni-spectral stealth applications.

Figure 5:
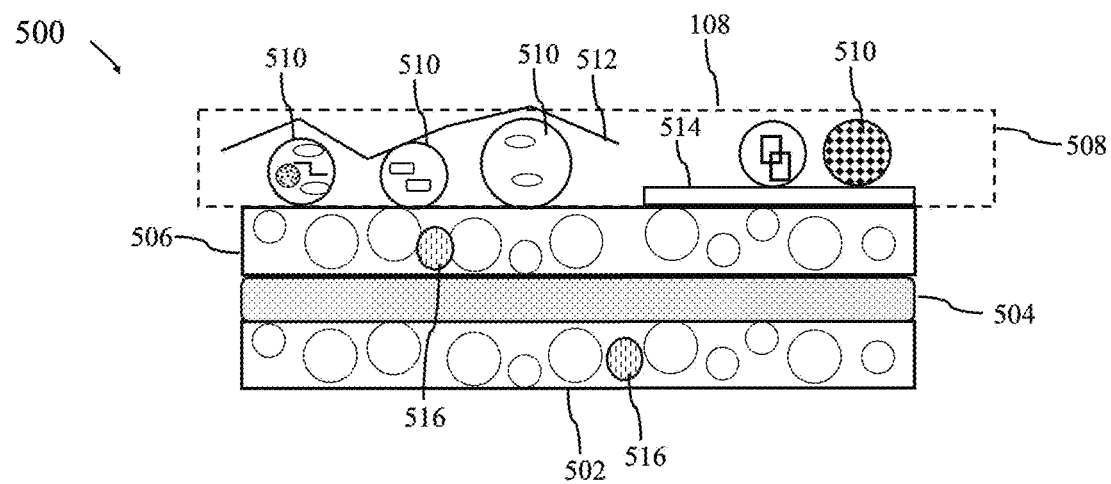
FIG. 5 is a pictorial of an alternative embodiment of camouflage and thermal management composite fabric system, in accordance with certain aspects of the present disclosure.

Referring now to FIG. 5, a pictorial 500 of another camouflage and thermal management composite fabric system is shown, according to various embodiments. In various embodiments, the composite fabric system comprises one or more composite layers. In various embodiments, the one or more layers comprises a first thermal insulation fabric layer 502, a conductive radar absorption material (RAM) fabric layer 504, a third layer 506 comprising said first thermal insulation fabric layer, and a fourth layer 508 comprising one or more defined surface area of the third layer, further comprising one or more dots 510 and at least one camouflage pigment pattern 512. In accordance with certain embodiments, at least one defined surface area of the third layer 506 comprises camouflage pigment pattern 512 printed on top of one or more dot 510. In another embodiment, at least one defined surface area of the third layer 506 comprises one or more dot 510 applied directly on top of the printed camouflage pigment pattern 514. In various embodiments, the thermal insulation fabric layers 502, 506, first and third, comprise at least one ceramic, aluminum, carbon, graphite, graphene, tin, or copper particle 516 or flakes embedded within the rubber or thermoplastic layer 502. In various embodiments, the thermal insulation fabric layers 502, 506 comprise, but not limited to, 1-10% rubber or 1-10% thermoplastic and 1-10% ceramic, or aluminum, carbon, graphite, graphene, or tin, or copper, or combinations thereof. In various embodiments, the one or more dots 510 comprises at least one metallic micro-nanoparticle 518 encapsulated within a dot 510. In various embodiments, a metallic micro-nanoparticle 518 comprises a magnetic, superparamagnetic, or diamagnetic iron oxide microparticle, including but not limited to; garnets, spinel ferrites, hexagonal ferrites, multiferroic materials, magneto-dielectric nanocomposites, high-permittivity ferromagnetic materials, iron oxide, magnetite ($Fe_3O_4$), hematite ($\alpha$-$Fe_3O_2$), or maghemite ($\gamma$-$Fe_2O_3$), combinations thereof, and the like. In various embodiments, a metallic micro-nanoparticle 518 comprises a micro-nanometer polar crystal, including but not limited to; cubic, orthorhombic, or monoclinic hafnium dioxide ($H_jO_2$), and the like. In various embodiments, the thermal insulation layers 502, 506 provides thermal emission control. In various embodiments, one or more magnetic iron oxide micro-nanoparticles 518 provide EM wave propagation control, including but not limited to conduction, reflection, absorption, transmission, and multi-reflection. In various embodiments, one or more hafnium dioxide micro-nanoparticles 518 provide EM wave propagation control, including but not limited to conduction, reflection, absorption, transmission, and multi-reflection. In various embodiments, one or more magnetic iron oxide micro-nanoparticles 518 provide human thermal propagation control, including but not limited to black body radiation propagation/emission. In various embodiments, one or more hafnium dioxide micro-nanoparticles 518 provide human thermal propagation control, including but not limited to black body radiation propagation/emission. In various embodiments, one or more spherical polymeric encapsulated magnetic micro-nanoparticles 510 provide EM wave propagation control, including but not limited to conduction, reflection, absorption, transmission, and multi-reflection. The high-performance camouflage and thermal management composite fabric system enables omni-spectral stealth applications.

Figure 6:
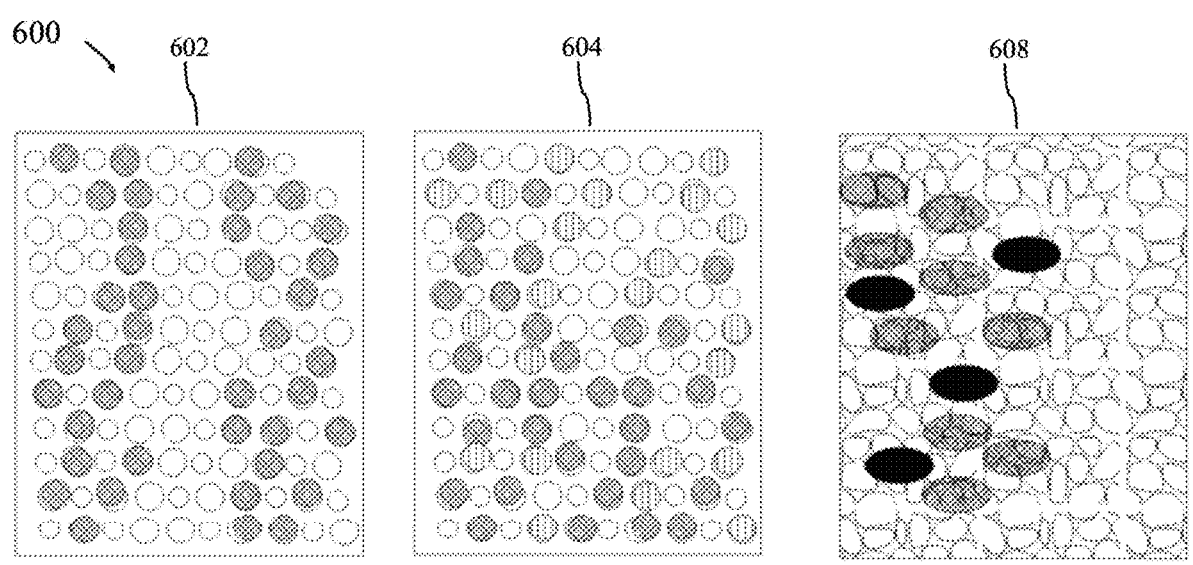
FIG. 6, is a pictorial of dot patterns in accordance with aspects of the present disclosure.

Referring now to FIG. 6, a pictorial 600 of dots are shown, according to various embodiments. In various embodiments dots corresponding to elements 306, 312 of FIG. 3, elements 408, 416 of FIG. 4, or element 510 of FIG. 5 are deposited or printed within, for example, layer 508 of FIG. 5, in one or more specified patterns. In one embodiment, one or more said dots are coated and applied in uniform to irregular pattern 602 with premade colors and function to produce a "frog-like" camouflage pattern. In another embodiment, one or more said dots are printed and then coated in uniform to irregular pattern 604, where dots are printed or coated with premixed chemicals for specific functions and then coated in camouflage pigments with specific functions. In another embodiment, layer 508 of FIG. 5 of one or more camouflage of the present disclosure is printed or sprayed or jet printed in broken or discrete sputter pattern 608, preferably with built in chemical function or coated on to; for example, layer 514 or layer 506 of FIG. 5, for specific function by one or more pigments, each with specific a function. A specific function includes but not limited to subsurface diffusion, conduction, reflection, absorption, transmission, and multi-reflection omni-spectral (e.g., visible, UV, NIR, IR, millimeter wave, radar, X ray, etc.) control of EM waves, thermal propagation, or black body radiation. It is understood that patterns 602,604,608 serve as non-limiting examples and that an infinite number of alternative patterns can be contemplated depending on stealth applications. In various embodiments, the creation of regular or optimally irregular sized, patterned, and shaped dots on the surface of a fabric are preferably designed to work as individual towers or "clones" of free-standing conductive polymer designed to mitigate thermal heat propagation/EM waves and provide omni-spectral shielding. In various embodiments, a dot composition may comprise, but is not limited to, 1-20% RAM (highly conductive carbon mixture with binder/cross binder), magnetite, conductive metal (aluminum/tin/copper, etc.), 1-20% magnetite or a paramagnetic material, 1-20% Aluminum or Alumina (reflective), 1-20% Thermal Plastic (polyester) polymer with blowing agent or latex with blowing agent (%) optional pigment or whitener (e.g., $T_iO_2$), optional Fire Retardant (%), any textile substrate woven, non-woven, or knit. In various embodiments, for insulation purposes, a dot composition can comprise one or more acrylic binder/resin polymer containing: a Fire Retardant (phosphorous based), ceramic microspheres, a reflective metal (e.g., Aluminum, Alumina, etc.), or a pigment, combinations thereof, and the like.

Figure 7:
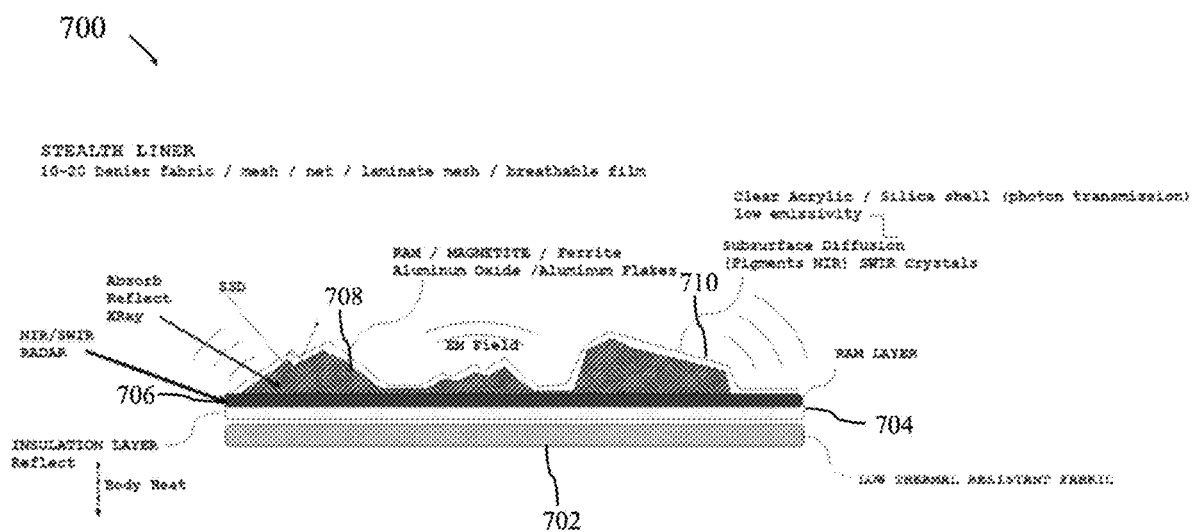
FIG. 7 is an example illustration of a stealth liner, in accordance with aspects of the present disclosure.

Referring now to FIG. 7, an example illustration 700 of a stealth liner is shown, according to various embodiments. In various embodiments, the stealth line comprises a 10-20 Denier fabric, mesh, net, laminate mesh, or a breathable film. In various embodiments, the stealth liner comprises a first thermal resistant layer 702 that is thermal resistant, a second insulation layer 704 that reflects body heat propagation, a third RAM layer 706, and one or more dot mixture 708 deposit on the surface of layer 706 providing various omni-spectral EM wave control. In one embodiment, layer 706 can be configured for detection mitigation in the NIR/SWIR/radar wavelength. In another embodiment, dot mixture 708 enables absorption/reflection of X-ray. In yet another embodiment, a layer of dots 710 containing one or more RAM, magnetite, aluminum oxide, carbon, graphite, graphene, aluminum flakes, NIR pigment, SWIR crystals, polar crystals, photonic crystals, or hafnium dioxide are deposited on top of dot mixture 708 to provide sub surface diffusion of EM waves. In certain embodiments, layer 710 comprises dots composed of clear acrylic or silica shell for photon transmission and low emissivity.

According to manufacturing techniques, non-woven fabrics are divided into several classifications like spun-bonded, heat sealing, spun lace, hydrophilic, melt blown stitch-bonded, air laid pulp, wet nonwoven fabrics, and needle punched. Needle-punching is a mechanical bonding technology that uses the frictional forces between fibers to bond fabric. This process is applicable for bonding any type of fiber, independent of material-type, length, and fineness. The method can process various dimensions of the original web from light- to heavy-weight. In the needle punching process, barbs of a needle catch the fibers and force them along the normal direction (ND) of the textile or fabric plane. The punched fibers form a pillar-shaped fiber bundle which acts as a bonding point in the fabric. An increase of the needling density creates more pillar-shaped fiber bundles in fabric. An increase of the needle penetration depth and needle gauge are thought to increase the number of fibers constituting each pillar-shaped fiber bundle. Non-woven fabric, have the advantages of an inherent 3-dimensional (3D) structure, low areal density, thin thickness, and good flexibility. In addition, the 3D architecture ensures that needle-punched fabrics can easily undergo significant amounts of deformation when subjected to an external force. The flexural properties of 3D needle-punched composites are much higher than those of woven laminate composites due to the Z-direction fibers through the thickness direction, which resist delaminating under the bending load conditions.

Figure 8:
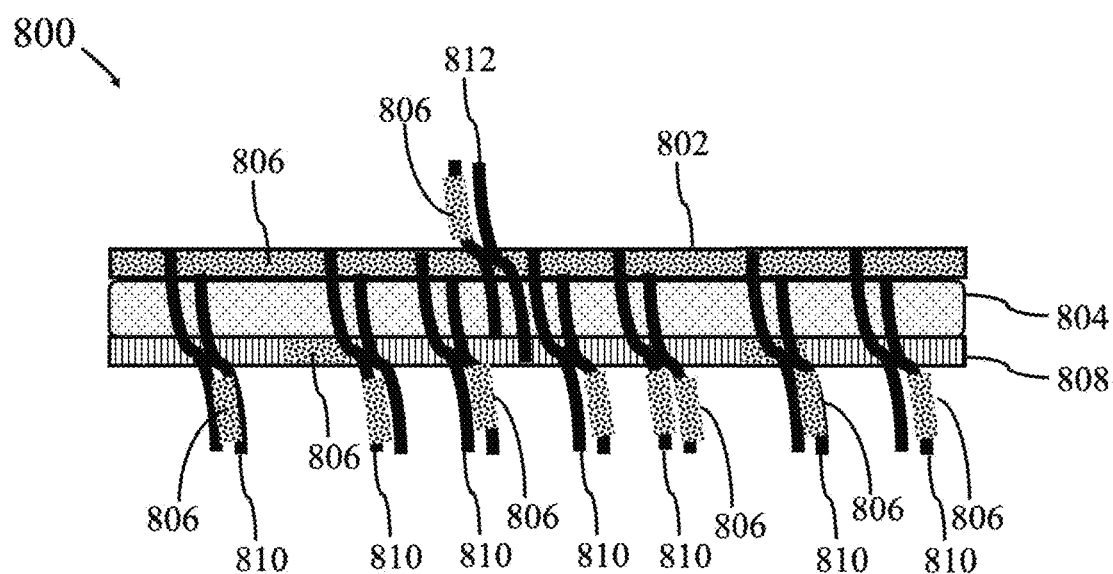
FIG. 8 is an example illustration of a 3D non-woven single blended textile, in accordance with aspects of the present disclosure.

Referring now to FIG. 8, an example illustration 800 of a 3D non-woven single blended textile is shown, according to various embodiments. In various embodiments, a 3D non-woven single blended textile comprises a first composite fabric substrate 802, a second thermal insulation felt layer 804, and one or more non-woven or mesh layer 806. In various embodiments said first composite fabric substrate 802 comprises one or more EM wave propagation and thermal emission control elements 806, including but not limited to, encapsulated or non-encapsulated, conductive carbon, graphite, graphene, aluminum, copper, or tin metal oxides, polar crystals, photonic crystals, ferrite, magnetic, paramagnetic, superparamagnetic, or ferromagnetic micro-nanoparticles or micro-nano flakes, RAM 1-20% RAM (highly conductive carbon mixture with binder/cross binder), magnetite, conductive metal (aluminum/tin/copper, etc.), 1-20% paramagnetic, or a paramagnetic material, 1-20% Aluminum or Alumina (reflective), antimony, antimony oxide, titanium, titanium oxide, zirconium, zirconium oxide, magnesium, magnesium oxide, organic materials such as, metal complexes, ionic dyes, extended p-conjugated chromophores, and donor-acceptor charge transfer chromophores and the like and combinations thereof. In various embodiments, the felt layer 804 comprises various fabric composition, including but not limited to, natural fibers such as wool or animal fur, or synthetic fibers such as petroleum-based acrylic or acrylonitrile, polyacrylonitrile (PAN) or polyester, polypropylene, Teflon, Nomex, Rayon, and Kevlar fibers or wood pulp-based rayon. This felt can be natural fiber composition which is optimal due to the natural nano scales which bind into felt such as wool hairs (human hairs) when compressed and mixed. In various embodiments, the thickness of felt layer 804 are non-limiting 0.5-25 mm, preferably 0.5 mm-1.0 mm. In certain embodiments, felt layer 804 is approximately 1-1.5 mm thick with a non-limiting weight of 0.5 to 1 ounce, 1.5 ounces, or 20 ounces. In various embodiments, felt layer 804 confers thermal insulation/regulation as well as fire retardancy (FR). In yet another preferred embodiment, felt layer 804 comprises 50%-100% PAN mixed with silica-based fiber in a 50%/50% ratio. In various embodiments, a third layer comprises a mesh 808 treated with at least one said EM wave propagation control thermal emission control element 806. This mesh 808 serves as a backing for the felt layer 804 to be processed via needle punching whereby barbed needles pull out felt layer 804 fibers through one side of the mesh 808 backing to form a single blended textile. In certain embodiments, the felt layer 804 is sandwiched between said first composite fabric substrate 802 and third mesh layer 808 and the single blended textile is processed via needle punching to produce one or more hair/fur-like protrusions 810 on one side of the single blended textile. In an alternative preferred embodiment, the single blended textile is processed via needle punching to produce one or more hair/fur-like protrusions 810 on one side of the single blended textile and one or more hair/fur-like protrusions 812 on the opposite side of the blended textile or fabric. The resulting protrusions 810, 812 subsequently incorporates one or more EM wave propagation and thermal emission control elements 806 of layer 802 and third layer 808 on the surface of said protrusions. In an alternative embodiment, the resulting protrusions 810, 812 subsequently incorporates one or more EM wave propagation and thermal emission control elements 806 of layer 802 and third layer 808 within an internal surface of said protrusions. The single blended 3D textile 800 provides EM wave propagation and thermal emission control capabilities, including but not limited to EM conduction, reflection, absorption, transmission, multi-reflection, and thermal conduction, convention, and radiation. In various embodiments, protrusions 810, 812 and produces an animal hair/fur like diffusion surface which is also an excellent insulative and aids in standoff from a thermal or heat emitting source. In various embodiments, the mesh 800 comprises a knit or woven substrate of natural or manmade fibers. In an alternative embodiment, the mesh 808 and can also be made from composite materials such as fiberglass and woven/knitted into a mesh. In various embodiments, the composite mesh 808 is exposed externally to the environment and a polyester or nylon knitted mesh 802 interfaces with the skin. In an alternative layer 808 provides a surface for printing one or more camouflage patterns.

Referring now to felt layer 804 of FIG. 8, in various embodiments, this felt is manufactured at different weights and thicknesses depending on the type of applications and operating environments or different scenarios. For example, a wearable stealth Garment or garment containing stealth via a stealth max liner can have minimal thickness in the base layer, felt 804, to save in bulk and weight. A stealth ULCANS net can have a thicker max liner base of felt to enable optimal IR detection mitigation performance over a vehicle or a human if weight and loft is not a disabler. In one embodiment, said max liner comprises felt layer 804 treated with stealth polymers of the present disclosure, such as RAM or reflective aluminum (ink/coating) and be a stand-alone textile. In an alternative embodiment, felt layer 804 is mated to at least one layer of mesh 808.

Certain aspects of the present disclosure define one or more stealth layers by modifying one or more layers of 3D non-woven single blended textile 800 of FIG. 8. In one embodiment, an EM wave propagation or thermal emission diffusion layer is configured on one or more outer surfaces of textile 800. This configuration enables IR detection mitigation as a reflective mirror surface: silver, aluminum, tin, or copper. In certain embodiments, this reflective surface is free of blemish and protected under a surface of glass. In an alternative embodiment, one or surface of single blended textile 800 is configured to optimize EM wave absorption via sub-surface diffusion (SSD) through a roughened surface or a surface having scatters, one or more EM wave propagation or thermal emission control elements 806, or one more protrusion 810, 812, that refract or cause multi-reflection of EM waves or thermal emission from a black body or a grey body radiation source. In various embodiments, mesh 808 comprises small filament, for example 10-15 Denier(D) knit fiber and preferably below 30 D. In various embodiments, mesh 808 comprises a layer of aluminum and subsequently said layer is treated with a thin layer of graphite or graphene. In various embodiments, one or more dot 510 of FIG. 5 are configured on one or more surface of blended textile 800. In one embodiment, said dot comprises a clear acrylic binder containing one or more crystalline nano structures such as photonic crystals or polar crystals to enable each dot to have SSD properties. In another embodiment, a stealth max liner is fabricated from single blended textile 800 having protrusion 810 or 812 to create SSD of EM wave propagation or thermal emission. In this case, felt 804 is a base layer and one or two consequent layers of mesh 808 either composite (e.g., fiberglass, carbon fiber, etc.) or man-made fiber knit mesh (polyester or nylon) with the felt 804 coated with select polymers (e.g., RAM/Aluminum, Ink/Crystals) as a flat substrate including for example crystals (e.g., photonic crystals, hafnium dioxide) and then fabricated using needle punching through one side of the composite textile mesh 808 to form one or more protrusion 810. The process creates a max liner comprising protrusions 810 coated with a specific EM wave propagation or thermal emission control elements 806 to enable SSD of EM wave or thermal radiation on the surfaces of one more protrusion 810 and into the subsurface of mesh 808. In this example, the felt layer 804 being on top is needled (barb needle pulled) through the composite mesh 808 below to form diffusion hair/fur-like protrusions ("RAM hair"). In various embodiments, the one or more protrusion 810 and the surface polymer composition of mesh 808 (e.g., transparent hollow core or fiberglass filament mesh) extends the propagation path length of EM wave or thermal conduction, convection, radiation for maximizing energy absorption or emission control. In various embodiments, the RAM hair protrusions are fabricated to possess an ordered or random pattern on at least one surface of textile 800. In various embodiments, textile 800 comprises stealth dots on one surface and RAM hair protrusions on the opposite side of the fabric. In alternative embodiments, a stealth max liner comprises a two-sided camouflage and a third layer bottom mesh (i.e., a camouflage printed polyester or nylon knit) needle punched into the system with the RAM hair being drawn out through it to create a darker side of a reverse camo in contrast to the opposite light side. In various embodiments, the light opposite side is preferably a roughened surface. In various embodiments, the surface is treated with a topcoat/protective covering/shell material); for example, waterproof silicone or clear acrylic or PVC. Application dependent, textile 800 can be configured and fabricated with a defined number of protrusions per unit surface area, protrusion diameter, protrusion length/depth. In various embodiments, the number of protrusions per unit surface may be, but not limited to, between 100-5000 per square centimeter. In various embodiments, the protrusion diameter may be, but not limited to, between 10-500 micrometer. In various embodiments, the protrusion length may be, but not limited to, between 0.1 to 10 centimeters. In various embodiments, textile 800 is fabricated with varying number of protrusions per unit area, diameter, and length to possess high emissivity in the non-atmospheric windows (5-8 µm) for radiative cooling and a low emissivity in the atmospheric windows (3-5 and 8-14 µm) for IR camouflage.

Figure 9:
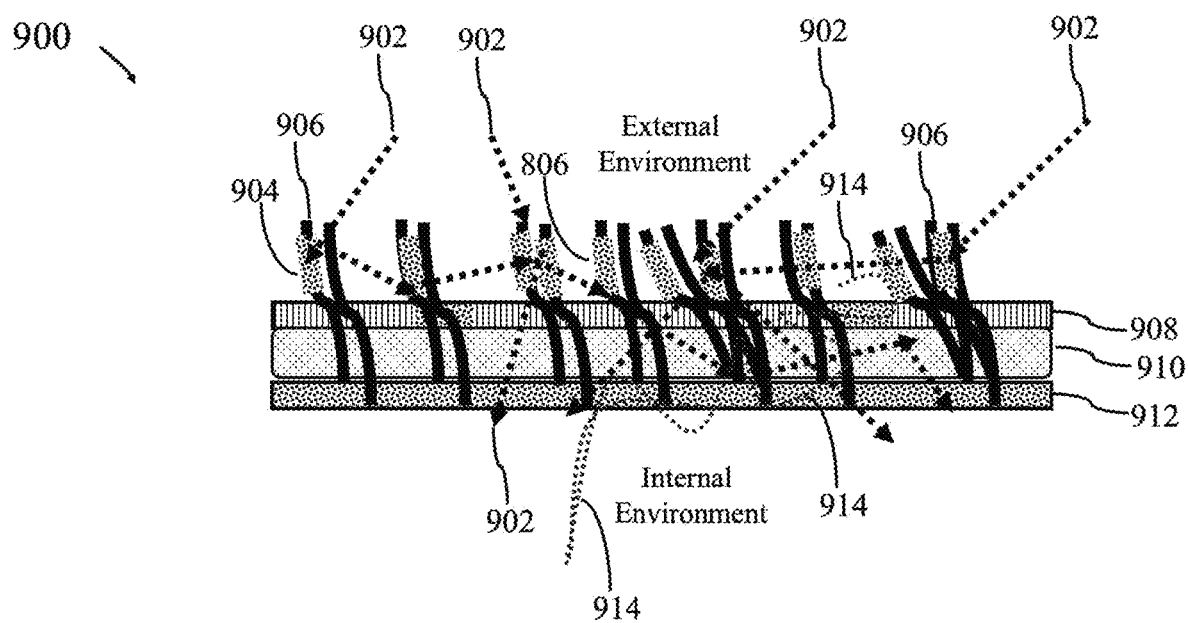
FIG. 9 is an illustration explaining the principle of EM wave propagation or thermal emission control by a non-woven single blended textile, in accordance with aspects of the present disclosure.

Referring now to FIG. 9, an illustration 900 explaining the principle of EM wave propagation or thermal emission control is shown, according to various embodiments. Without being bound to theory, one or more EM wave photon 902 from an external environment enters one or more dot 904, equivalent to dot 510 of FIG. 5, said dot attached to one or more protrusion 906, equivalent to protrusion 810 of FIG. 8, and are reflected/refracted at random angles back out of the system or deeper into the sub-surfaces 908, equivalent to stealth mesh 808 of FIG. 8, felt layer 910, equivalent to felt layer 804 of FIG. 8 or treated stealth mesh 912, equivalent to mesh 808 of FIG. 8, and eventually reflected/refracted/multiple reflection with a random or programmed degree of spectral energy dissipation or loss. One or more protrusion 906 is preferably constructed to optimize impedance matching to ensure that an amount of incident EM wave enters one or more dot 904 and scatters between one or more protrusion 906 containing or coated with dots on its surfaces. In various embodiments, that impedance match is achieved when the mass ratio of one or more control elements 806 of FIG. 8 are in various ratio, preferably at least two individual elements, in various ratio, preferable in a 1:1 ratio, resulting in maximum EM wave absorption. In addition, needle punched non-woven has porous structures by the tangling of one or more protrusion 906 that aides in efficient microwave absorption. These non-woven can have periodic or non-periodic regions in their structure that are caused by the interaction of fibers with needle barbs. Fiber segments are re-orientated and migrated from the surface of the web towards the interior of the fabric and become perpendicular to the plane. This rearrangement of fibers due to processing increases the structural anisotropy as compared with the original web and therefore the structure of needle-punched fabrics is not homogenous. The mechanics of the bulk structure are influenced by the entanglement of fibers within a non-woven, regulating the mechanical interactions between the fibers. In the process of entanglement, fibers manipulated with barbed needles are transferred from the horizontal to the vertical plane, meanwhile, the fibers bend, curl and one part of them remains in the thickness direction. This results in a reduction in the straight segment fiber length within the horizontal plane. The result of this phenomena can cause lateral spreading or forward Mie scattering of incident light or EM wave 902 in different directions, the process controlled by the jumping of the light rays from fiber-to-fiber contacts through their crossing areas or crimping, the phenomena occurring also in the sub-surfaces 908, 910, 912 of the structure. Randomness is a key factor for broadband and omnidirectional anti-reflection through varying refraction indexes(indices). With respect to thermal emission control, the crimp structure of one or more protrusion 906 improves IR light heat reflectance with one or more solid-air interface, keeping thermal emission contained within an internal environment and minimizing thermal emission 914 or radiation. In addition, the use of micro-denier(D) fibers can create fabrics with high bulk density that yields textile structures with high tortuosity and/or small pores. The high tortuosity/porosity contributes to a reduction in thermal emission 914 conduction whereby air has much smaller thermal conduction and the micro-gap or small pore size can match the mean-free path of the air gas molecules. Thus, the needle punched non-woven structures of the present disclosure can be configured to display restricted convection within micro pores, reduced conduction at solid-gas interfaces, and multiple reflected radiation of thermal emission 914 from parallel or lamellar fiber orientation for thermal emission control and mitigation of IR or heat detection.

The camouflage and thermal management woven, and non-woven composite textile fabric systems of the present disclosure may be used as a fabric that may undergo further operations to become a finished good. The fabric may be used for any article where omni-spectral camouflage for stealth applications is desired such as articles of clothing, uniform, tent, tent liner, sleep system, tarp, shell, blanket, net, bevy, cocoon, helmet cover, pack cover, throw, laminate, ULCANS, reversible camouflage to cover objects and more. As a garment, the fabric may be used for any suitable garment including, but not limited to, pants, shirts, outer-wear such as jackets, shoes, hats, scarves, and belts. The camouflage and thermal management composite systems may undergo further operations to become a stealth liner, laminate system, or needle punched blended single textile applied to any other textile or solid surface, for example, vehicle (e.g., a tank), or a hangar or building structure.

Figure 10:
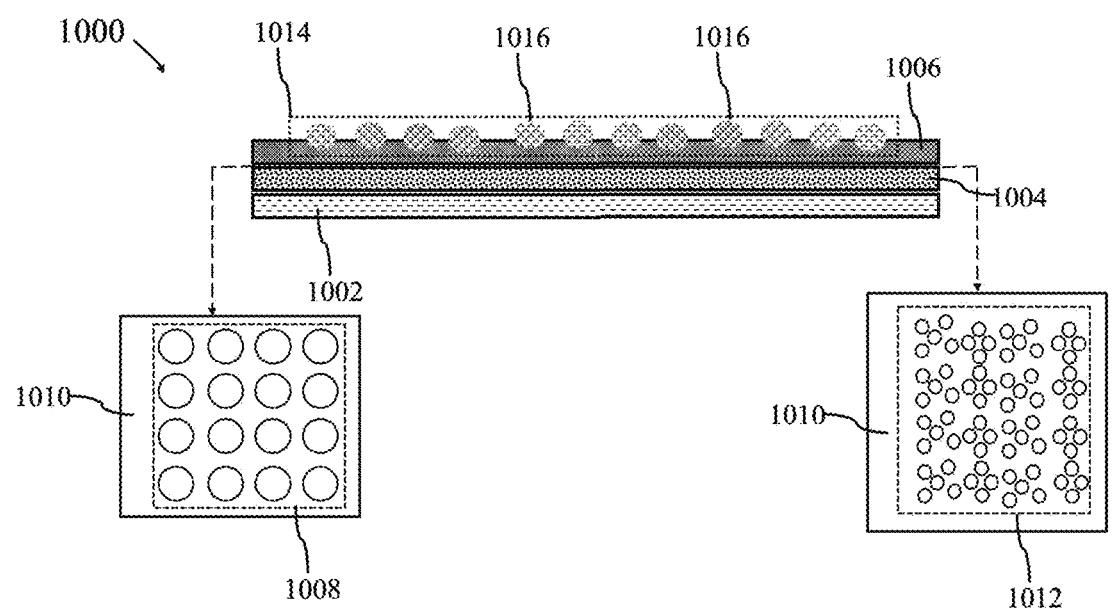
FIG. 10 is an illustration of a stealth liner, in accordance with aspects of the present disclosure.

Referring now to FIG. 10, an example illustration 1000 of a stealth liner is shown, according to various embodiments. The stealth liner comprises a substrate layer and one or more coating layers containing one or more stealth coating matrix applied sequentially to the substrate layer. In various embodiments, the stealth liner comprises a substrate base layer 1002, a first conductive thermal reflective coating layer 1004, and second infrared absorbing material (IRAM) polymer coating layer 1006. In various embodiments, substrate layer 1002 comprises a woven or non-woven fabric, preferably a non-woven knit substrate of optimal thickness composition and Denier. In various preferred embodiments, conductive thermal reflective coating layer 1004 comprises one or more aluminum flake deposited onto the surface of substrate base layer 1002 through various deposition methods, including but not limited, screen-printing, pad coating, dip coating, knife over edge coating. The aluminum flakes are deposited in one or more pattern to create a stealth coating matrix. In certain embodiments, a stealth coating matrix pattern 1008 is printed as a first layer on the surface 1010 of conductive thermal reflective layer 1004. In certain embodiments, the stealth coating matrix pattern 1008 is an ordered, periodic or Faraday cage pattern. In an alternative preferred embodiment, stealth coating matrix pattern 1012 is printed on the surface 1010 of conductive thermal reflective layer 1004. In certain embodiments, the stealth coating matrix pattern 1012 is an aperiodic, modified broken, or random pattern. In various embodiments, a second infrared absorbing material (IRAM) polymer layer 1006 is printed on top of the first conductive thermal reflective layer 1004, preferably in Faraday cage pattern 1008. In certain embodiments, the IRAM comprises graphite and a polymer binder to enable binding to the fabric of the stealth liner. In various embodiments, a third thermal emission control layer 1014 is printed on top of infrared absorbing material (IRAM) polymer layer 1004. In various embodiments, third thermal emission control layer 1014 comprises one or more dot 1016 deposited as a broken surface to enable thermal-electromagnetic sub-surface diffusion. In various embodiments, dot 1016 may be modified from uniform to semi-uniform surface dots, to create broken irregular surface disruptions, resembling for example the surface of paper through a needling process. In various embodiments, one or more said dot 1016 contains magnetic micro-nanoparticles deposited on the surface of infrared absorbing material (IRAM) polymer coating layer 1006, enabling EM wave diffusion and a causal sub-surface diffusion (SSD), and in combination with layers 1002, 1004 to retard in human or mechanical black body radiation, emission, or propagation. In certain embodiments, the one or more dot 1016 are fabricated using a clear/transparent thermoplastic or clear a polyester resin. In another preferred embodiment, one or more dot 1016 are fabricated using a clear/transparent thermos-adhesive. In certain embodiments, one or more dot 1016 provides a protective coating to the stealth micro liner for abrasion proofing. In an alternative preferred embodiment, one or more dot 1016 is applied to the opposite surface of substrate layer 1002 to provide a protective coating to the stealth micro liner for abrasion proof of substrate layer 1002. In certain embodiments, one or more said dot 1016 contains at least one paramagnetic micro-nanoparticle, aluminum oxide, ferrite metal particle, copper particle, manganese particle, photonic crystal, and/or barium sulfide. In an alternative preferred embodiment, one or more said dot 1016 contains at least one paramagnetic micro-nanoparticle, aluminum oxide, ferrite metal particle, copper particle, manganese particle, photonic crystal, barium sulfide and graphite to produce a grey stealth liner. In various embodiments, the outermost layer (surface) 1014 controls EM and/or thermal radiation, propagation, diffusion in combination with one or more said micro-nanoparticles encapsulated within a polymeric thermoplastic dot 1016 above or below the surface of the IRAM of polymer layer 1006 or coated on or in the IRAM itself In various embodiments, one or more magnetic micro-nanoparticles provide EM wave propagation control, including but not limited to, electrical conduction, reflection, absorption, transmission, and multi-reflection. In various embodiments, one or more spherical polymeric encapsulated magnetic micro-nanoparticles, within one or more dot 1016, provide EM wave propagation control, including but not limited to diffusion, conduction, reflection, absorption, transmission, and multi-reflection.

Figure 11:
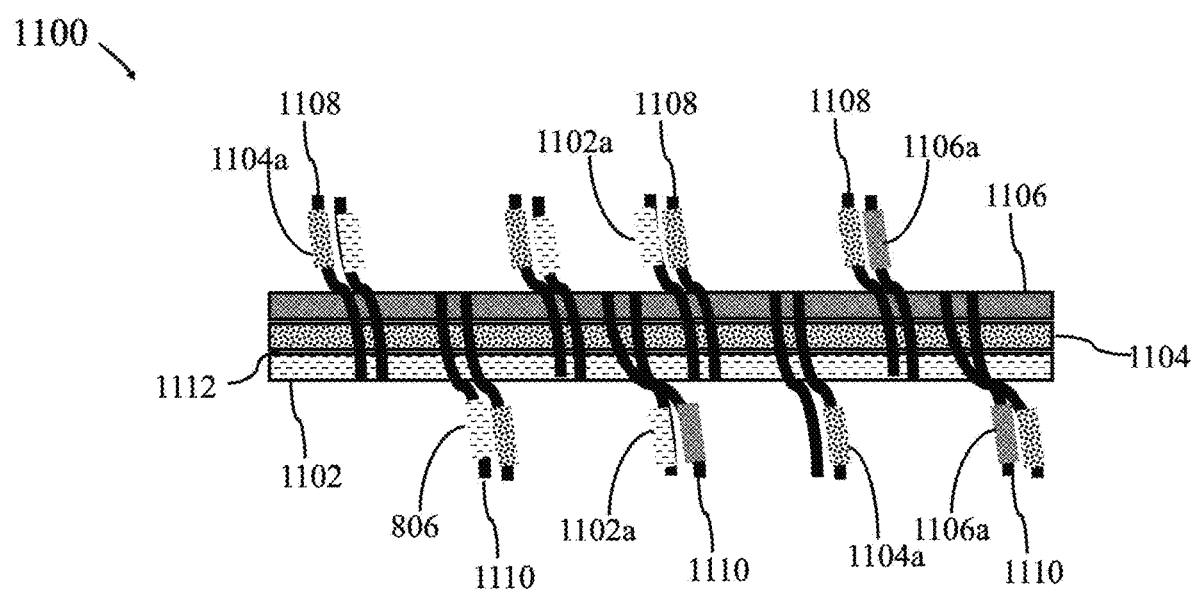
FIG. 11 is an illustration of a stealth insulator, in accordance with aspects of the present disclosure.

Referring now to FIG. 11, an example illustration 1100 of a stealth insulator is shown, according to various embodiments. The stealth insulator comprises a substrate layer and one or more coating layers containing one or more stealth coating matrix applied sequentially to the substrate layer. In various embodiments, the stealth insulator comprises a substrate base layer 1102, a first conductive thermal reflective coating layer 1104, and second infrared absorbing material (IRAM) polymer coating layer 1106. In various embodiments, substrate layer 1102 comprises a woven or non-woven fabric, preferably a non-woven knit substrate of optimal thickness composition and Denier. In various preferred embodiments, conductive thermal reflective coating layer 1104 comprises one or more aluminum flake deposited onto the surface of substrate base layer 1002 through various deposition methods, including but not limited, screen-printing, pad coating, dip coating, knife over edge coating. The aluminum flakes are deposited in one or more pattern to create a stealth coating matrix. In certain embodiments, a stealth coating matrix pattern 1108, equivalent to matrix pattern 1008 of FIG. 10, is printed as a first layer on the surface 1110 of conductive thermal reflective layer 1104. In certain embodiments, the stealth coating matrix pattern 1108 is an ordered, periodic, or Faraday cage pattern. In an alternative preferred embodiment, stealth coating matrix pattern 1112 is printed on the surface 1110 of conductive thermal reflective layer 1104. In certain embodiments, the stealth coating matrix pattern 1112, equivalent to matrix pattern 1012 of FIG. 10, is an aperiodic, modified broken, or random pattern. In various embodiments, a second infrared absorbing material (IRAM) polymer layer 1106 is printed on top of the first conductive thermal reflective layer 1104, preferably in Faraday cage pattern. In certain embodiments, the IRAM comprises graphite and a polymer binder to enable binding to the fabric of the stealth insulator. In various embodiments, substrate layer 1102 and one or more coating layers 1104, 1106 containing one or more stealth coating matrix processed via needle punching whereby barbed needles pull out one or more protrusions with materials from within substrate layer 1102 and coating layers 1104, 1106. In certain embodiments, the substrate layer 1102 and one or more coating layers 1104, 1106 is processed via needle punching to produce one or more hair/fur-like protrusions 1108 on one side of the stealth insulator fabric or textile. In an alternative preferred embodiment, the substrate layer 1102 and one or more coating layers 1104,1106 is processed two or more times via needle punching to produce one or more hair/fur-like protrusions 1108 on one side of the single blended textile and one or more hair/fur-like protrusions 1110 on the opposite side of the stealth insulation fabric, textile, or insulator. The resulting protrusions 1108, 1110 subsequently incorporates material or composition 1102a, 1104a, 1106a from one or more of substrate layer 1102, thermal reflective layer 1104, or IRAM coating layer 1106 as hair/fur-like protrusions. In various embodiments, the stealth insulator comprises a stealth liner disclosed in FIG. 10 incorporating a combination of aluminum and graphite with dots or without dots and needle punched twice; once on one side and once on the opposite side. The single blended stealth insulator provides EM wave propagation and thermal emission control capabilities, including but not limited to EM conduction, reflection, absorption, transmission, multi-reflection, and thermal conduction, convention, and radiation. In various embodiments, protrusions 1108, 1110 produce an animal hair/fur like diffusion surface serving as an excellent insulative and aids in standoff from a thermal or heat emitting source.

Figure 12:
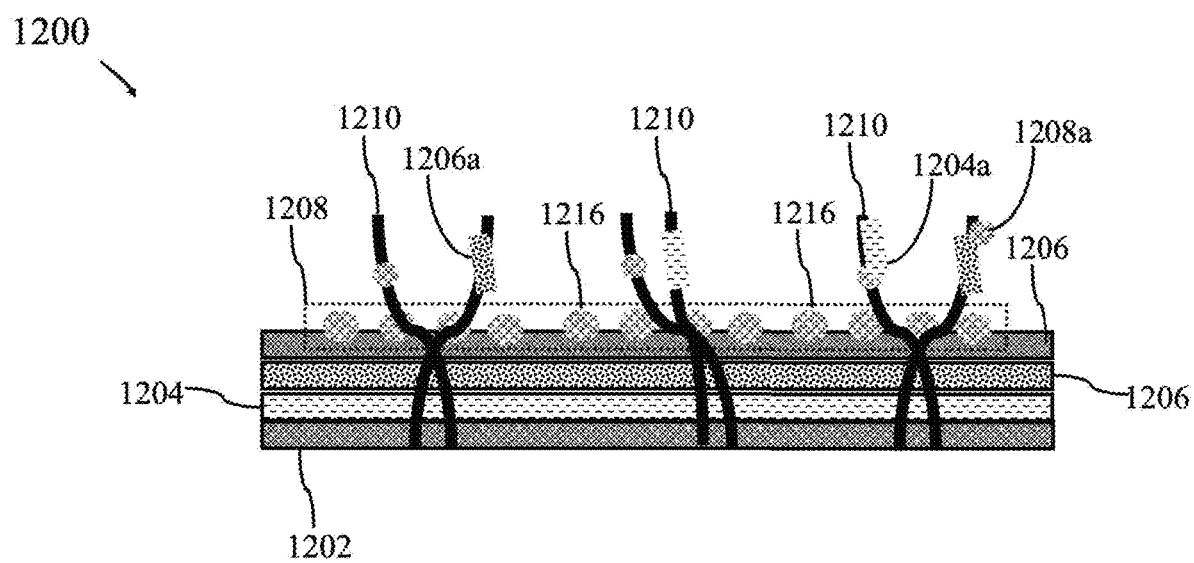
FIG. 12 is an illustration of a stealth shell in accordance with aspects of the present disclosure.

Referring now to FIG. 12, an example illustration 1200 of a stealth shell is shown, according to various embodiments. The stealth shell comprises a substrate layer and one or more coating layers containing one or more stealth coating matrix applied sequentially to the substrate layer. In various embodiments, the stealth liner comprises a felt layer 1202, substrate layer 1204, equivalent to 1002 of FIG. 10, first conductive thermal reflective coating layer 1206, equivalent to 1004 of FIG. 10, and infrared absorbing material (IRAM) polymer coating layer 1208, equivalent to layer 1006 of FIG. 10. In various embodiments, felt layer 1202 comprises various fabric composition, including but not limited to, natural fibers such as wool or animal fur, or synthetic fibers such as petroleum-based acrylic or acrylonitrile, polyacrylonitrile (PAN) or polyester, polypropylene, Teflon, Nomex, Rayon, and Kevlar fibers or wood pulp-based rayon. This felt can be natural fiber composition which is optimal due to the natural nano scales which bind into felt such as wool hairs (human hairs) when compressed and mixed. In various embodiments, the thickness of felt layer 1202 are non-limiting 0.5-25 mm, preferably 0.5 mm-1.0 mm. In certain embodiments, felt layer 1202 is approximately 1-1.5 mm thick with a non-limiting weight of 0.5 to 1 ounce, 1.5 ounces, or 20 ounces. In various embodiments, felt layer 1202 confers thermal insulation/regulation as well as fire retardancy (FR). In yet another preferred embodiment, felt layer 1204 comprises 50%-100% PAN mixed with silica-based fiber in a 50%/50% ratio. In certain embodiments, the felt layer 1202 and layers 1204, 1206, 1208 is processed via needle punching to produce one or more hair/fur-like protrusions 1210 on one side of the stealth shell. The resulting protrusions 1210 subsequently incorporates material or composition, for example 1204a, 1206a, 1208a from one or one or more felt layer, substrate layer, thermal reflective, or IRAM coating layers 1202, 1204, 1206, 1208 as hair/fur-like protrusions. The single blended stealth shell, having the surface with one or more protrusion 1220 positioned to interface with an external environment, provides EM wave propagation and thermal emission control capabilities, including but not limited to EM conduction, reflection, absorption, transmission, multi-reflection, and thermal conduction, convention, and radiation.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." As used herein, the terms "right," "left," "top," "bottom," "upper," "lower," "inner" and "outer" designate directions in the drawings to which reference is made.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one of a number or lists of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The present disclosure includes that contained in the appended claims as well as that of the foregoing description. Although this invention has been described in its exemplary forms with a certain degree of particularity, it is understood that the present disclosure of has been made only by way of example and numerous changes in the details of construction and combination and arrangement of parts may be employed without departing from the spirit and scope of the invention.

What is claimed is:

1. A stealth material composition comprising:
   a substrate layer comprising a woven or a non-woven fabric;
   a first layer disposed on a surface of the substrate layer, the first layer comprising a conductive thermal reflective coating,
   wherein the conductive thermal reflective coating comprises aluminum flake disposed on the surface of the substrate layer,
   wherein the aluminum flake is disposed on the surface of the substrate layer according to at least one pattern to comprise a stealth coating matrix,
   wherein the stealth coating matrix comprises a Faraday cage pattern;
   a second layer disposed on the first layer, the second layer comprising an infrared absorbing material coating comprising graphite and a polymer binder; and
   a plurality of elongated protrusions disposed on and extending outwardly from at least one surface of the stealth material composition,
   wherein the plurality of elongated protrusions comprises a plurality of fibers, each fiber in the plurality of fibers having a diameter in the range of 10 micrometers to 500 micrometers and a length in the range of 0.1 centimeters to 10 centimeters,
   wherein the plurality of elongated protrusions are configured to extend a propagation path length of an electromagnetic wave arriving at the at least one surface of the stealth material composition,
   wherein the stealth material composition is configured as a wearable garment.

2. The stealth material composition of claim 1 further comprising a third layer disposed on the second layer, wherein the third layer comprises a thermal emission control layer comprising a plurality of dots disposed on the infrared absorbing material coating.

3. The stealth material composition of claim 2 wherein the plurality of dots are irregularly disposed on the infrared absorbing material coating to define a broken surface of the third layer.

4. The stealth material composition of claim 3 wherein the at least one pattern is selected from the group consisting of ordered, periodic, and modified broken.

5. The stealth material composition of claim 2 wherein the plurality of dots are fabricated of a transparent thermoplastic or transparent polyester resin.

6. The stealth material composition of claim 5 wherein the plurality of dots comprises one or more paramagnetic particles encapsulated in each dot in the plurality of dots.

7. The stealth material composition of claim 6 wherein the one or more paramagnetic particles comprise at least one particle selected from the group consisting of aluminum oxide particles, ferrite metal particles, copper particles, manganese particles, photonic crystal particles, barium sulfide particles, and graphite particles.

8. A stealth material composition comprising:
a substrate layer comprising a woven or a non-woven fabric substrate;
a first layer disposed on a surface of the substrate layer, the first layer comprising a conductive thermal reflective coating;
a second layer disposed on the first layer, the second layer comprising an infrared absorbing material coating, wherein the infrared absorbing material coating comprises graphite and a polymer binder; and
a plurality of elongated protrusions disposed on and extending outwardly from at least one surface of the stealth material composition,
wherein the plurality of elongated protrusions comprises a plurality of fibers, each fiber in the plurality of fibers having a diameter in the range of 10 micrometers to 500 micrometers and a length in the range of 0.1 centimeters to 10 centimeters,
wherein the plurality of elongated protrusions are configured to extend a propagation path length of an electromagnetic wave arriving at the at least one surface of the stealth material composition,
wherein the stealth material composition is configured as a wearable garment.

9. The stealth material composition of claim 8 wherein aluminum flake is disposed on the surface of the substrate layer according to one or more pattern to comprise a stealth coating matrix.

10. The stealth material composition of claim 9 wherein the one or more pattern is selected from the group consisting of ordered, periodic, Faraday cage, modified broken, and random.

11. The stealth material composition of claim 8 further comprising a plurality of dots comprising a thermoplastic or polyester resin disposed on one or more elongated protrusion in the plurality of elongated protrusions.

12. The stealth material composition of claim 11 wherein the plurality of dots comprises one or more paramagnetic particles encapsulated in each dot in the plurality of dots.

13. The stealth material composition of claim 12 wherein the one or more paramagnetic particles comprise at least one particle selected from the group consisting of aluminum oxide particles, ferrite metal particles, copper particles, manganese particles, photonic crystal particles, barium sulfide particles, and graphite particles.

14. A stealth material composition comprising:
a felt layer;
a substrate layer disposed on the felt layer and comprising a woven or a non-woven fabric;
a first layer disposed on the substrate layer, the first layer comprising a conductive thermal reflective coating, wherein the conductive thermal reflective coating comprises aluminum flake disposed on a surface of the substrate layer;
a second layer disposed on the first layer, the second layer comprising an infrared absorbing material coating, wherein the infrared absorbing material coating comprises graphite and a polymer binder; and
a plurality of elongated protrusions disposed on and extending outwardly from at least one surface of the stealth material composition,
wherein the plurality of elongated protrusions comprises a plurality of fibers, each fiber in the plurality of fibers having a diameter in the range of 10 micrometers to 500 micrometers and a length in the range of 0.1 centimeters to 10 centimeters,
wherein the plurality of elongated protrusions are configured to extend a propagation path length of an electromagnetic wave arriving at the at least one surface of the stealth material composition,
wherein the stealth material composition is configured as a wearable garment.

15. The stealth material composition of claim 14 wherein the felt layer comprises a fabric composition comprising wool fiber or fur fiber.

16. The stealth material composition of claim 14 wherein the felt layer has a thickness in the range of 0.5 millimeters to 1.5 millimeters.

17. The stealth material composition of claim 14 wherein the felt layer comprises a fabric composition comprising a polyacrylonitrile fiber and a silica-based fiber.

18. The stealth material composition of claim 14 wherein the aluminum flake is disposed on the surface of the substrate layer according to at least one pattern to comprise a stealth coating matrix.

19. The stealth material composition of claim 1 further comprising a plurality of dots comprising a thermoplastic or polyester resin disposed on one or more elongated protrusion in the plurality of elongated protrusions.

20. The stealth material composition of claim 14 further comprising a plurality of dots comprising a thermoplastic or polyester resin disposed on one or more elongated protrusion in the plurality of elongated protrusions.

* * * * *